(12) United States Patent
Rivaud et al.

(10) Patent No.: US 12,389,527 B2
(45) Date of Patent: Aug. 12, 2025

(54) ASIC BUSBAR WITH REMOTE POWER PHASES FOR TELECOMMUNICATIONS AND NETWORKING SHELF AND CIRCUIT CARD ASSEMBLIES

(71) Applicant: Ciena Corporation, Hanover, MD (US)

(72) Inventors: Daniel Rivaud, Ottawa (CA); Fabien Colton, Kars (CA); Luc Lacourciere, Stittsville (CA); Lloyd Cosman, Stittsville (CA)

(73) Assignee: Ciena Corporation, Hanover, MD (US)

( * ) Notice: Subject to any disclaimer, the term of this patent is extended or adjusted under 35 U.S.C. 154(b) by 213 days.

(21) Appl. No.: 18/230,754

(22) Filed: Aug. 7, 2023

(65) Prior Publication Data

US 2025/0056709 A1   Feb. 13, 2025

(51) Int. Cl.
*H05K 1/02*   (2006.01)

(52) U.S. Cl.
CPC ......... *H05K 1/0213* (2013.01); *H05K 1/0271* (2013.01); *H05K 2201/10272* (2013.01)

(58) Field of Classification Search
CPC ...... H05K 1/02; H05K 1/0213; H05K 1/0271; H05K 2201/10272

USPC .......................................... 361/783
See application file for complete search history.

(56) References Cited

U.S. PATENT DOCUMENTS

2020/0408832 A1\* 12/2020 Hovis ................ G01R 31/2851
2021/0036702 A1   2/2021 Gan et al.
2022/0115844 A1   4/2022 Shearman et al.

OTHER PUBLICATIONS

International Search Report issued in corresponding PCT Application No. PCT/US2024/041040.

\* cited by examiner

*Primary Examiner* — Tremesha W Burns
(74) *Attorney, Agent, or Firm* — Clements Bernard Walker; Christopher L. Bernard

(57) ABSTRACT

A circuit assembly includes a printed circuit board, an integrated circuit chip coupled to the printed circuit board, and a plurality of power phases associated with the integrated circuit chip arranged as grouped power phases. One or more power phases of the grouped power phases is physically distanced from a side of the integrated circuit chip associated with physically distanced power phase(s) of the grouped power phases.

20 Claims, 24 Drawing Sheets

ASIC BUSBAR WITH REMOTE POWER PHASES FOR TELECOMMUNICATIONS AND NETWORKING SHELF AND CIRCUIT CARD ASSEMBLIES

TECHNICAL FIELD

The present disclosure relates generally to the telecommunications and networking fields. More particularly, the present disclosure relates to telecommunications and networking shelf, circuit card assemblies, and circuit packs utilizing grouped power phases and an associated busbar around an integrated circuit chip for reduced signal track length, lower power consumption, and improved cooling efficiency.

BACKGROUND

In an optical switching system with cable-based fabric, it is desirable to reduce signal track length between client ports and fabric ports and an integrated circuit chip, such as an application specific integrated circuit (ASIC) chip, in order to reduce power consumption. Such ports include quad small form factor pluggable-double density (QSFP-DD) ports and octal small form factor pluggable (OSFP) ports, for example.

Conventionally, most shelf and circuit card assemblies utilize generally forward-facing higher power client ports and generally forward-facing lower power fabric ports. An ASIC is disposed behind all these ports. In descriptions herein, the terms integrated circuit chip, ASIC chip, and ASIC may be used interchangeably depending on the context. This arrangement allows full frontal inlet airflow to pass over all optical and electrical ports to cooling fans located at the rear of the shelf and circuit card assemblies, for example. Client ports may be spaced apart to accommodate larger heatsinks for the higher power devices. Fabric ports may be in ganged cages as they have lower power consumption and do not require larger heatsinks. Datacenter customers may use lower power client ports because they may be shorter reach (e.g., 2 km), and may demand lower power consumption from optical ports.

The present background is provided as illustrative environmental context only and should not be construed to be limiting in any manner. It will be readily apparent to those of ordinary skill in the art that the principles and concepts of the present disclosure may be implanted in other environmental contexts equally.

SUMMARY

The present disclosure relates to telecommunications and networking shelf and circuit card assemblies, circuit assemblies, and circuit packs utilizing grouped power phases physically distanced from sides of an integrated circuit associated with the grouped power phases. In one illustrative embodiment, the present disclosure provides a circuit assembly adapted to be inserted into a conformal shelf assembly. The circuit assembly includes a printed circuit board, an integrated circuit chip coupled to the printed circuit board, and a plurality of power phases associated with the integrated circuit chip arranged as grouped power phases. One or more power phases of the grouped power phases is physically distanced from a side of the integrated circuit chip associated with physically distanced power phase(s) of the grouped power phases.

In some embodiments, the circuit assembly may further include a busbar communicatively coupled between the physically distanced power phase(s) of the grouped power phases and the side of the integrated circuit chip associated with the physically distanced power phase(s). In an additional or alternative embodiment, the busbar may be communicatively coupled between a second physically distanced power phase of the grouped power phases and a second side of the integrated circuit chip associated with the second physically distanced power phase. In an additional or alternative embodiment, the busbar may be communicatively coupled between a third physically distanced power phase of the grouped power phases and a third side of the integrated circuit chip associated with the third physically distanced power phase. In an additional or alternative embodiment, the busbar may be communicatively coupled between a fourth physically distanced power phase of the grouped power phases and a fourth side of the integrated circuit chip associated with the fourth physically distanced power phase. In an additional or alternative embodiment, the busbar may define a U-shaped profile with each side of the U-shaped busbar coupled to a separate side of the integrated circuit chip. In additional or alternative embodiments, the circuit assembly may further include a second busbar communicatively coupled between a third physically distanced power phase of the grouped power phases and a third side of the integrated circuit chip associated with the third physically distanced power phase. In some such embodiments, the second busbar may be communicatively coupled between a fourth physically distanced power phase of the grouped power phases and the second side of the integrated circuit chip associated with the fourth physically distanced power phase. In additional or alternative embodiments, the busbar(s) is coupled to the printed circuit board and disposed conformally around at least a portion of the perimeter of the integrated circuit chip. In an additional or alternative embodiment, the first busbar may be further configured as a stiffener adapted to at least partially support the integrated circuit chip relative to the printed circuit board. In some embodiments, the first busbar may include a dual layer busbar having a power path and a return path.

In additional or alternative embodiments, the grouped power phases may be positioned proximate to one side of the integrated circuit chip. In additional or alternative embodiments, the grouped power phases may include separately arranged subgroups of the grouped power phases, and each subgroup of the grouped power phases may include a power phase associated with a side of the integrated circuit chip that is different from the sides of the integrated circuit chip associated with the power phases of the other subgroups of the grouped power phases. In additional or alternative embodiments, the circuit assembly may further include a power phase card coupled to the printed circuit board, and the grouped power phases may be directly coupled to the power phase card. In additional or alternative embodiments, the power phase card may be physically distanced from three sides of the integrated circuit chip. In additional or alternative embodiments, the power phase card may include a power card busbar communicatively coupled between the grouped power phases and another busbar associated with the integrated circuit chip.

In additional or alternative embodiments, the circuit assembly may be configured as a circuit card assembly, and the printed circuit board may be disposed in a case. In additional or alternative embodiments, the circuit assembly may include a plurality of cages coupled to the printed circuit board and disposed around the integrated circuit chip.

In additional or alternative embodiments, each cage of the plurality of cages may be positioned within one inch of a side of the integrated circuit chip associated with the cage. In additional or alternative embodiments, each cage of the plurality of cages may be positioned within 0.7 inches of a side of the integrated circuit chip associated with the cage. In additional or alternative embodiments, the cages of the plurality of cages may be angled relative to a front faceplate of the case such that lengths of tracks between the cages and the integrated circuit chip are less than a predetermined maximum length. In additional or alternative embodiments, the predetermined maximum length may be three inches.

In another aspect, the present disclosure is related to a circuit pack including a printed circuit board, an integrated circuit chip coupled to the printed circuit board, and a plurality of power phases associated with the integrated circuit chip arranged as grouped power phases. One or more power phases of the grouped power phases is physically distanced from a side of the integrated circuit chip associated with physically distanced power phase(s) of the grouped power phases.

In some embodiments, the circuit pack may further include a busbar communicatively coupled between the physically distanced power phase(s) of the grouped power phases and the side of the integrated circuit chip associated with the physically distanced power phase(s).

BRIEF DESCRIPTION OF THE DRAWINGS

The present disclosure is illustrated and described with reference to the various drawings, in which like reference numbers are used to denote like assembly and/or system components and/or method steps, as appropriate.

Figure 1A:
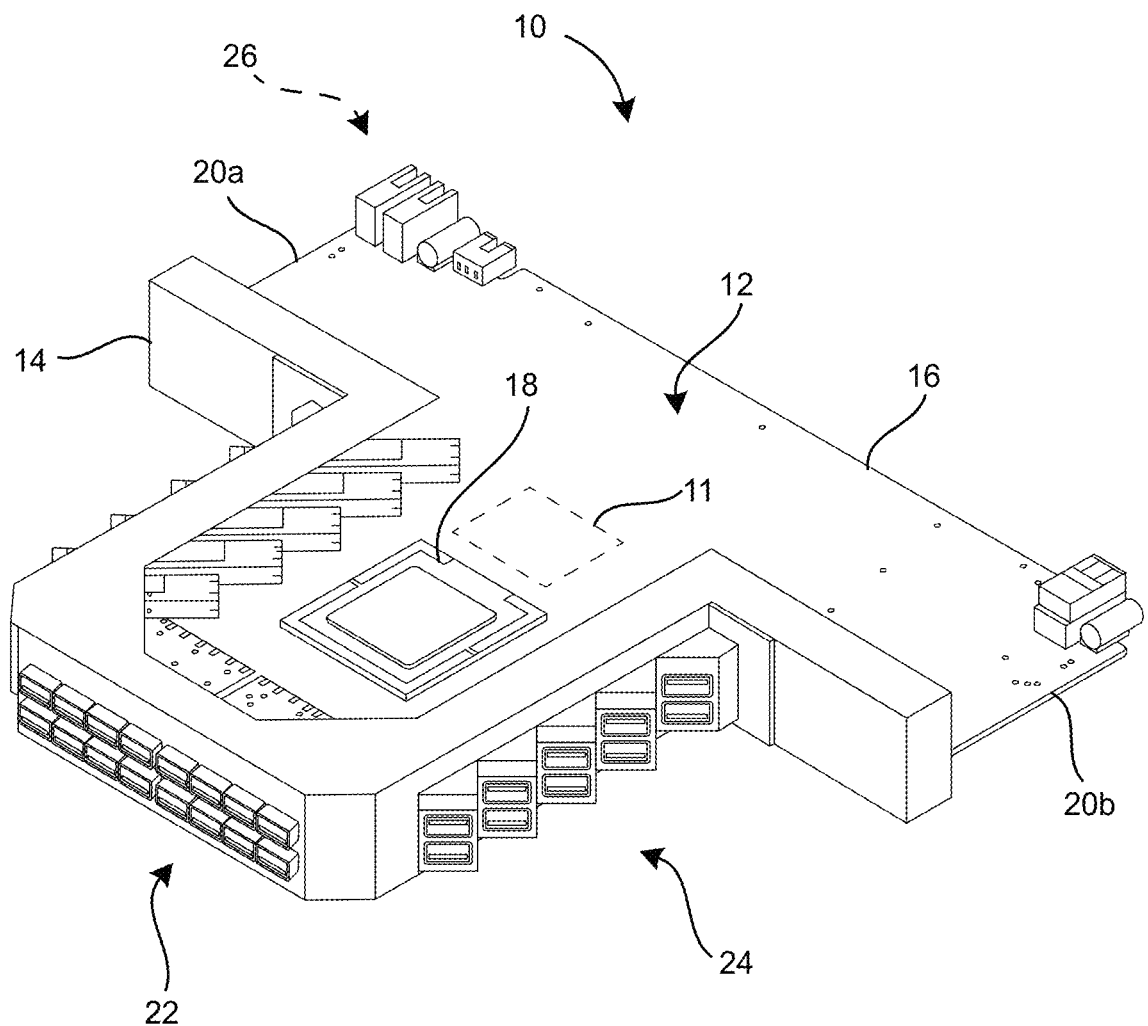
FIG. 1A illustrates a perspective view of one embodiment of a shelf assembly and circuit card assembly, in accordance with aspects of the present subject matter.

It will be readily apparent to those of ordinary skill in the art that aspects and features of each of the illustrated embodiments may be incorporated, omitted, and/or combined as desired in a given application, without limitation.

DETAILED DESCRIPTION

The present disclosure relates to telecommunications and networking shelf, circuit card assemblies, and circuit packs utilizing grouped power phases communicatively coupled to integrated circuits, such as an ASIC, utilizing one or more associated busbars. Optionally, disclosed networking shelves, card assemblies, and/or circuit packs may be utilized in conjunction with an angled and/or stepped arrangement of ports around an ASIC. As indicated herein, the present disclosure is based on the concept that it is possible to reduce power consumption by arranging client ports closer to the designated client connections of an integrated circuit such as an ASIC and fabric ports closer to the designated fabric connections of the ASIC. It is desirable to position the QSFP-DD/OSFP connectors within a short distance (e.g., within about 3 inches) of these ASIC connections. However, power phases of an ASIC surrounding the ASIC generally prevent the QSFP-DD/OSFP connectors from being positioned as close to the ASIC as desired or required. Thus, the power phases of the ASIC are grouped and positioned away from two or more sides of the ASIC such that the QSFP-DD/OSFP connectors may be positioned closer to such sides and reduce power consumption of the ASIC. In some embodiments, the ports are positioned at angles and stepped on the front corners, and optionally along the front face, of a circuit card. These ports may be client ports and/or fabric ports. The side faces of the circuit card may be reserved for mounting guidance.

Embodiments described herein address a variety of challenges. For example, hyperscalers are facing a challenge, which is that optics modules, including serializer/deserializers (SerDes) consume 60% of datacenter power, where optimal consumption would be nearer to 30%. Embodiments of the present disclosure address this challenge.

The industry has identified various solutions to challenges associated with co-packaged optics (CPOs), vertical line cards (VLCs), and linear drive optics (LDOs), and Twinax flyover, etc. Embodiments of the present disclosure address these challenges. For example, CPOs aim to reduce PCB length by putting the optics on the same substrate as the chip and thus reducing SerDes power. CPOs cause a significant change to the technical ecosystem, and also to the business ecosystem. VLCs use existing PCB technology to shorten PCB length, but is ineffective. LDOs eliminate the DSP power in the optical plug. Embodiments described herein improve the signal integrity and reach of LDOs by shortening the PCB length to the LDO optical module. Twinax flyover may effectively reduce loss, but it is expensive, requires expensive board assembly, and adds connectors to the link, which diminish the benefit.

Embodiments described herein shorten PCB tracks as much as possible. Embodiments also have superior attributes relative to VLC, which is accomplished by wrapping the cages around 3 sides of the mainboard integrated circuit or ASIC in a geometry that minimizes distance. Embodiments use a geometry that maintains visibility, installation, and cooling. Shorter PCB tracks reduce high-speed serial signal loss, allow increased signal density, while keeping loss constant, and/or combination thereof. Embodiments reduce high-speed serial signal loss and contribute to power savings by both primary and secondary effects.

Embodiments enable lower-loss interconnect enables reduced transmit signals, while maintaining sufficient receiver performance associated with bit error ratio (BER), frame loss ratio, etc. A reduced transmit signal level reduces the power dissipation in the interconnect and receiver termination directly. Power in the transmitter termination may also be reduced in voltage mode drivers or by reducing the transmitter driver power supply in current mode drivers.

Baseband electrical interconnect loss increases with frequency and that characteristic increases with length. Interconnects that are more highly frequency dependent demand progressively more powerful receivers in order to maintain adequate receiver performance. Some examples of functions that may need to be added are listed below. These functions are typically added incrementally, and in some cases the lowest power solution may result from using a non-incremental subset. Each additional function requires the addition of more circuitry or logic leading to increased power dissipation. Embodiments described herein address these challenges, including other challenges associated with increased drive voltage, transmitting (TX) equalization, receiving (RX) equalization, data retiming, multiple layers of forward error correction (FEC), complex receiver designs employing maximum-likelihood sequence estimation (MLSE) equalizers instead of simple decision slicers, etc.

Fundamentally, there are physics limitations to the signal loss that result from conductor loss mechanisms (e.g., resistance and skin effect, etc.). These limits reduce the achievable signal bandwidth density. As such, limiting the signal length enables higher signal bandwidth density, which embodiments described herein provide. Embodiments described herein are compatible within the overall router architecture and reduce overall power consumption to the benefits of user/customers. Embodiments provide a cell fabric that flattens leaf-spine hierarchy to enable use of fewer ASICs and fewer optical interconnects. Embodiments provide a plug ecosystem for fabric ports, which enables the lowest-power technology to be employed for each reach, including digital-to-analog converts (DACs), linear amplifier ACC, E-tube, uLED, LD short-reach optical, retimed LR optical, coherent optical, etc.

Embodiments provide liquid cooling, which reduces fan power and heating, ventilation, and air conditioning (HVAC) power. Embodiments described herein may stand independently from a router. Embodiments may be applied beyond routers and may improve top-of-rack switches, servers, artificial intelligence (AI)/machine learning (ML)/high-performance computing (HPC), etc.

Figure 1B:
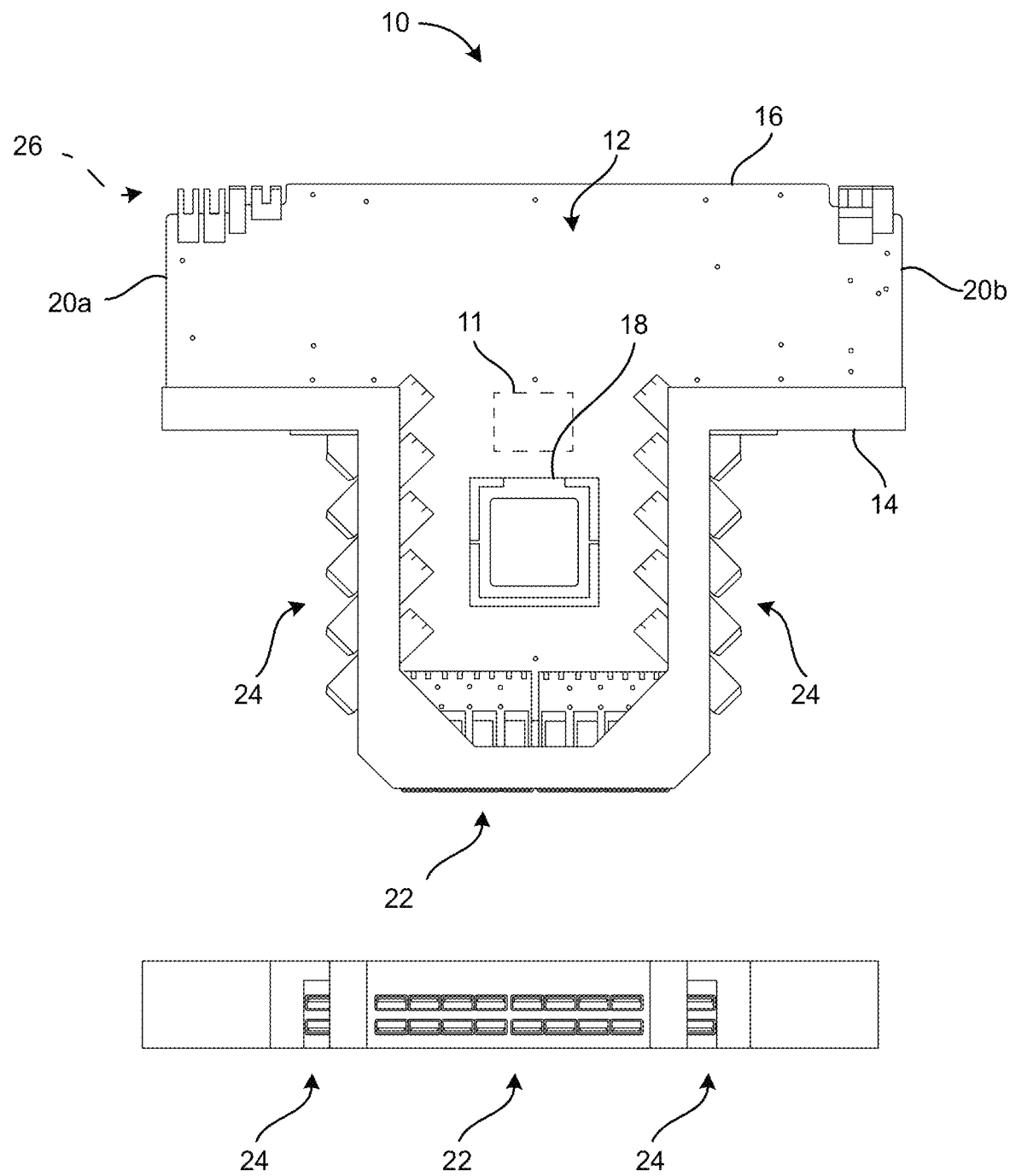
FIG. 1B illustrates a top view and a front view of the embodiment of the shelf assembly and circuit card assembly of FIG. 1A, in accordance with aspects of the present subject matter.

FIG. 1 illustrate a perspective view (FIG. 1A) and a top view and a front view (FIG. 1B) of one embodiment of a shelf assembly and circuit card assembly, collectively referred to as a "shelf system." Shown is a shelf assembly 10 and a circuit card assembly or circuit pack (circuit card assembly 12). The shelf assembly is adapted to receive the inserted conformal circuit card assembly 12. This example circuit card assembly 12 may include client ports to be switched and may be referred to as a client box, which may also include fabric ports to exchange data with a second type of fabric box circuit card assembly, which may be referred to as a fabric box. An example fabric box circuit card assembly is described below in connection with FIGS. 2A (perspective view) and 2B (top and front views).

As shown, the shelf assembly 10 includes a chassis or housing, or case 14 that is adapted to receive multiple inserted circuit card assemblies 12 in a vertical configuration. The terms chassis, housing, and case may be used interchangeably. The case 14 defines an opening adapted to provide access to a plurality of ports of the circuit card assembly 12, where the circuit card assembly 12 is adapted to be inserted into the shelf assembly 10.

Each circuit card assembly 12 includes a printed circuit board 16 or printed circuit board assembly (PCBA) 16 that includes an integrated circuit chip 18 or ASIC chip or ASIC 18 and multiple additional components that are not described in further detail here. While an ASIC chip is a particular type of integrated circuit chip, the terms integrated circuit chip, ASIC chip, and ASIC may be used interchangeably depending on the context. In various embodiments, the integrated circuit chip 18 may be other types integrated circuit chips. As shown, each circuit card assembly 12 includes grouped power phases 11 (depicted in phantom in FIGS. 1A, 1B, 2A, 2B, 4A, 4B, and 7), as will be described in greater detail below.

As illustrated, the side edges 20a and 20b of the board 16 or a surrounding frame may be used as a mounting guide for inserting the circuit card assembly 12 into the shelf assembly 10, which may include a plurality of corresponding guide rails (not shown). The circuit card assembly 12 also includes ports provided on the board 16, including a plurality of cages coupled to the printed circuit board 16 and disposed around the integrated circuit chip 18. In various embodiments, the cages are angled relative to a front faceplate of the case such that lengths of tracks between the cages and the integrated circuit chip 18 are less than a predetermined maximum length. The predetermined maximum length may vary, depending on the particular implementation. For example, the predetermined maximum may be 5", 4", 3", 2", etc.

As shown, the cages may include a plurality of client ports 22 and a plurality of fabric ports 24 configured to receive a plurality of small plug form factor connectors such as QSFP-DD/OSFP connectors or the like. These ports may be coupled to individual cages and connectors, or ganged cages and connectors. Example embodiments directed to cages are described in more detail below in connection with FIG. 6, for example. As illustrated, in this shelf assembly 10, the client ports 22 are disposed at the front face of the circuit card assembly 12, while the fabric ports 24 are disposed at the front angled corners of the circuit card assembly 12 on either side of the client ports 22. The ASIC 18 is disposed on the board 16 behind the client ports 22 and the fabric ports 24. Although other precise configurations are possible, a common thread is that both the client ports 22 and the fabric ports 24 are accessible from the front of the shelf assembly 10 and circuit card 12. As described in more detail below, air cooling is provided to the board components and connections via one or more fans (not shown) disposed at the back of the shelf assembly 10, near backplane and/or rear portion 54. The fans are typically configured to generate a front-to-back and/or side-to-back airflow.

In this circuit card assembly 12, the ports or connections of the ASIC 18 are generally arranged around the perimeter of the generally square ASIC body, with the client ports on the front side and halfway or more back along adjacent sides of the ASIC body, for example. On the same chip, the fabric ports may be arranged around the opposite back corners. The track or trace lengths from the client ports 22 to the client ports of the ASIC 18 are thus relatively short, given the placement of the ASIC 18 behind the client ports 22. The track lengths from the fabric ports 24 to the fabric ports of the ASIC 18 are relatively short, given the placement of the ASIC 18 behind the fabric ports 24, as shown. Note that the terms track and trace may be used interchangeably. The particular track lengths are advantageously short.

In various embodiments, to reduce track lengths as much as possible, the QSFP-DD/OSFP connectors that interact with the ASIC are disposed at substantially 45-degree angles to the ASIC on all four corners. The particular angle may vary and will depend on the particular implementation. The ASIC may also be rotated 45 degrees such that the sides of the ASIC body are parallel to the port surfaces, with the appropriate connections being disposed in closest proximity on the ASIC.

In this example arrangement, the client ports are arranged towards the front of the equipment frame, while the fabric ports are arranged toward the front outer corners of the equipment frame and are used for fabric switching. Other configurations are possible. For example, the client ports and the fabric ports may be swapped such that the fabric ports are arranged towards the front of the equipment frame, while the client ports are arranged toward the front outer corners of the equipment frame. In another example embodiment, the client ports may be arranged towards the front of the equipment frame and toward the front outer corners of the equipment frame, while the fabric ports may be arranged toward the rear outer corners of the equipment frame. The placement of client and fabric ports may vary, depending on the particular implementation. In various embodiments, at least some of the cages are stepped relative to each other. In various embodiments, ports are coupled to the cages such that each cage has a port coupled thereto. As such the ports connected to stepped cages are also stepped relative to each other. In all of these variations, at least some ports, whether client ports or fabric ports, are configured at an angle relative to the front of the equipment frame and stepped relative to each other.

As indicated herein, the side faces of the circuit card assembly are reserved for mounting guidance when the circuit card assembly is inserted into a conformal shelf assembly. An extended rear portion of the circuit card assembly disposed between the back corner fabric ports provides area for power entry and handling, control, and liquid cooling entry, when used. In general, the shelf and circuit card assemblies of the present disclosure may utilize air cooling and/or liquid cooling, such as in a hybrid cooling system.

Figure 2A:
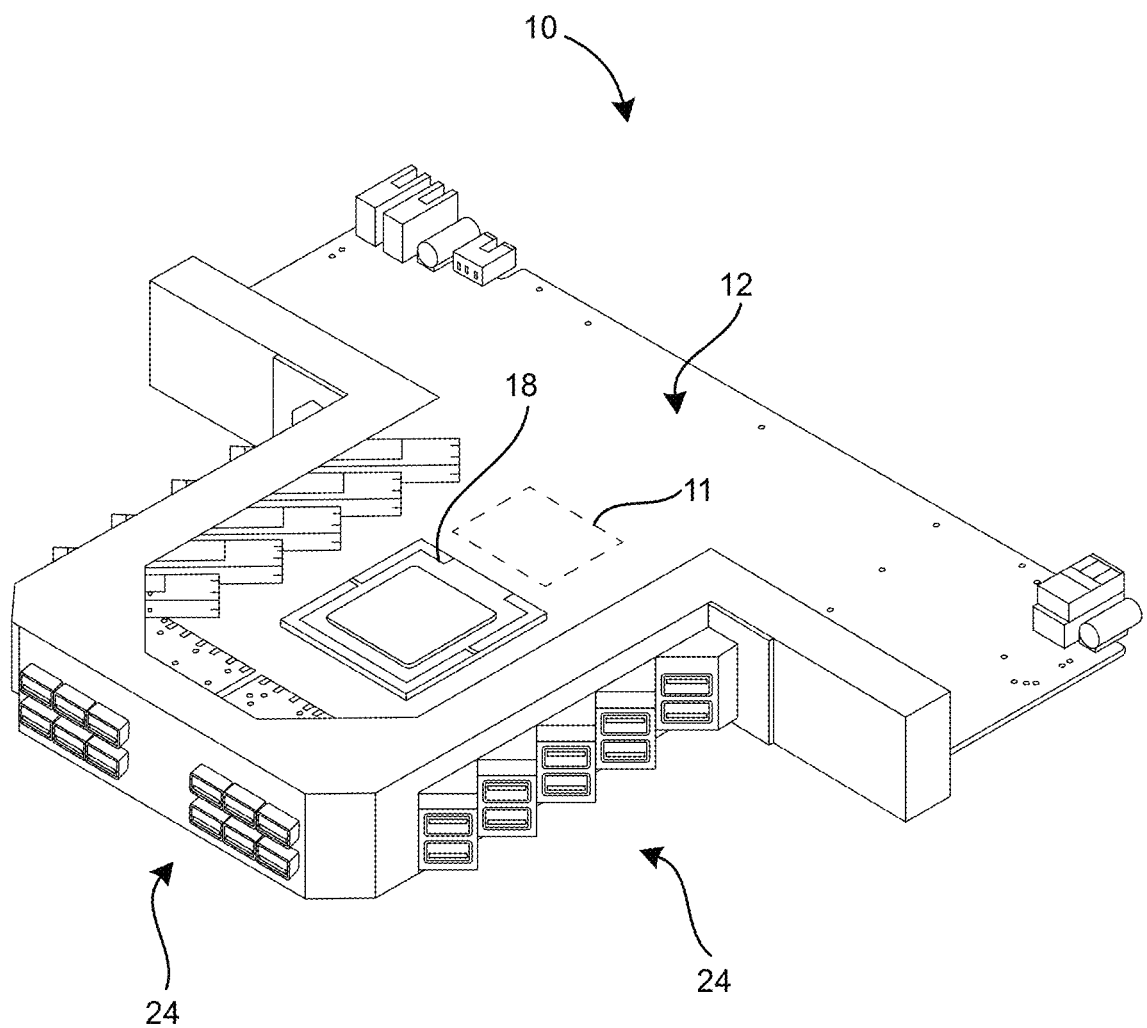
FIG. 2A illustrates a perspective view of one embodiment of a shelf assembly and circuit card assembly of a shelf system, in accordance with aspects of the present subject matter.
Figure 2B:
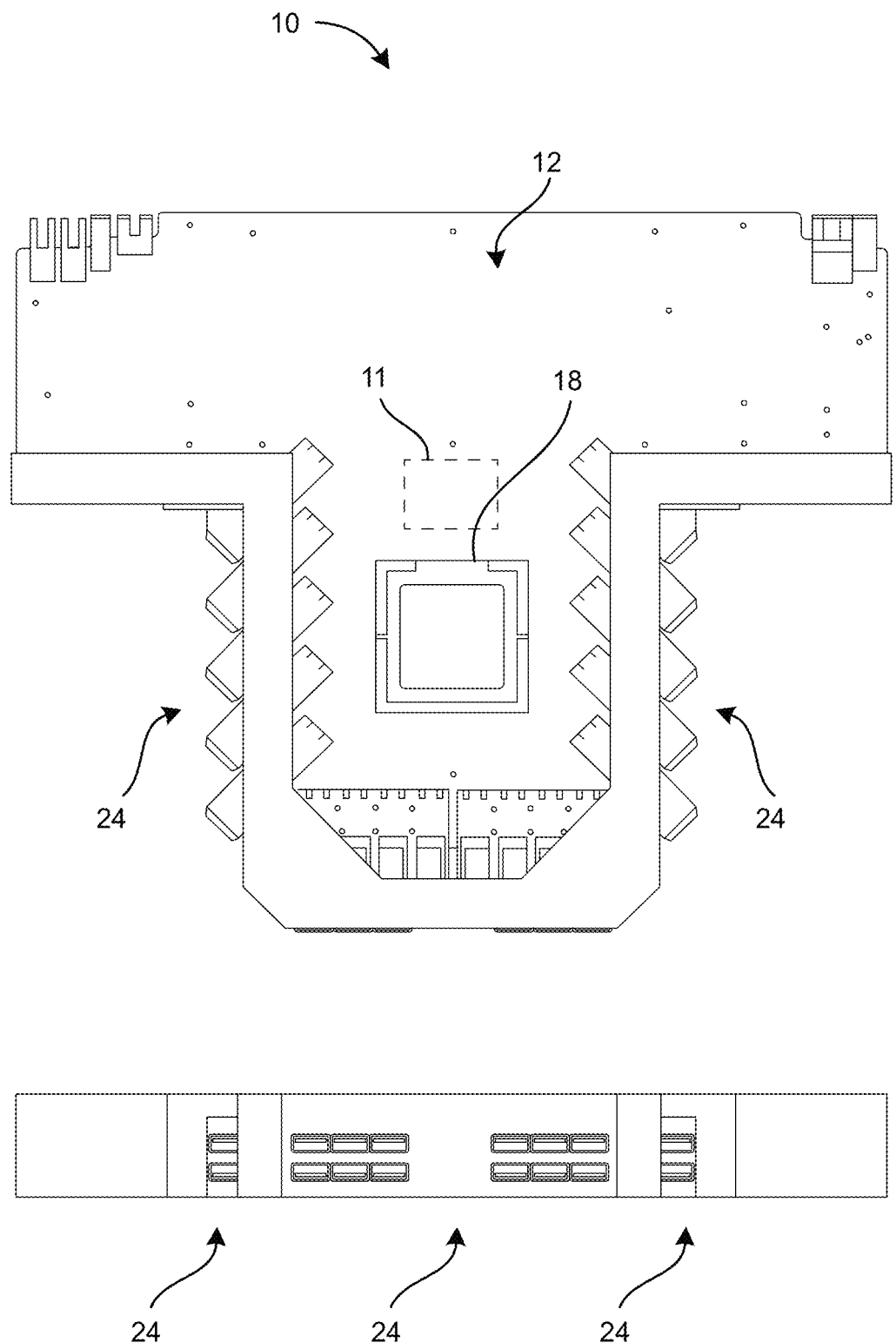
FIG. 2B illustrates a top view and a front view of the embodiment of the shelf assembly and circuit card assembly of the shelf system of FIG. 2A, in accordance with aspects of the present subject matter.

Again, as contemplated herein, by way of example only, there are two types of circuit card assemblies that may be used in the shelf assembly, providing a switching fabric topology. A circuit card assembly with client ports to be switched may be referred to as a client box as shown in FIGS. 1A and 1B, which may also include fabric ports to exchange data with a second type of fabric box circuit card assembly referred to as a fabric box as shown in FIGS. 2A and 2B described below. Thus, the present disclosure contemplates multiple similar arrangements of client ports and fabric ports on circuit card assemblies that plug into a unique generally octagonal shaped shelf assembly, providing four sides of port access with minimized signal track length, reduced power consumption, and improved cooling efficiency.

FIG. 2 illustrate a perspective view (FIG. 2A) and a top view and a front view (FIG. 2B) of one embodiment of a shelf assembly and circuit card assembly of a shelf system of the present disclosure. This example the shelf assembly 10 includes the circuit card assembly 12 with fabric ports 24 may exchange data with fabric ports of a client box circuit card assembly, such as that of FIGS. 1A and 1B. As shown in FIGS. 1A, 1B, 2A, and 2B, the integrated circuit chip 18 is disposed in a central portion of the printed circuit board and between a plurality of fabric ports and a plurality of client ports couped to the cages.

Figure 3A:
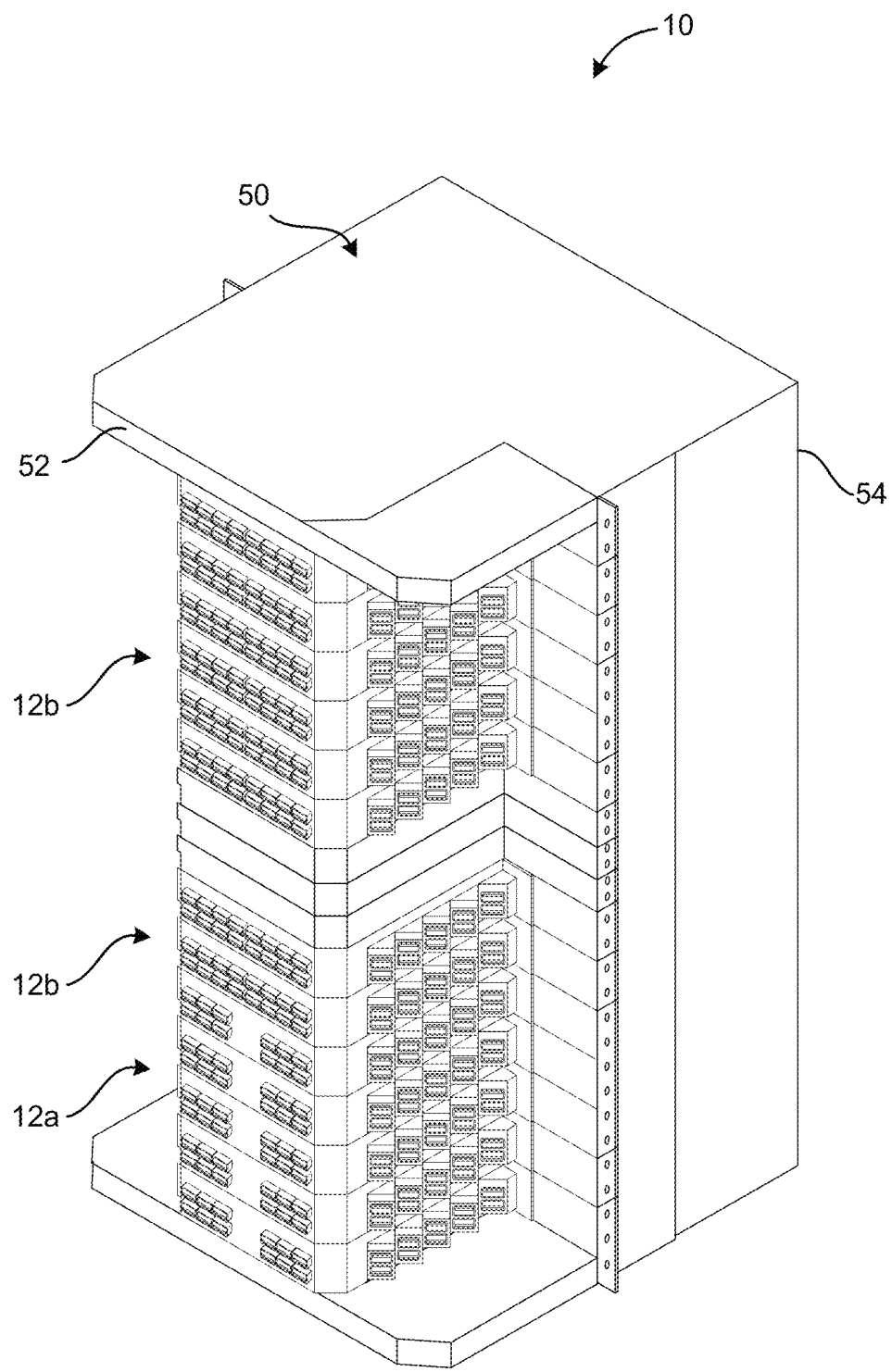
FIG. 3A illustrates a perspective top view of the front of one embodiment of a shelf assembly with a plurality of circuit cards assemblies installed in a vertical stack, in accordance with aspects of the present subject matter.
Figure 3B:
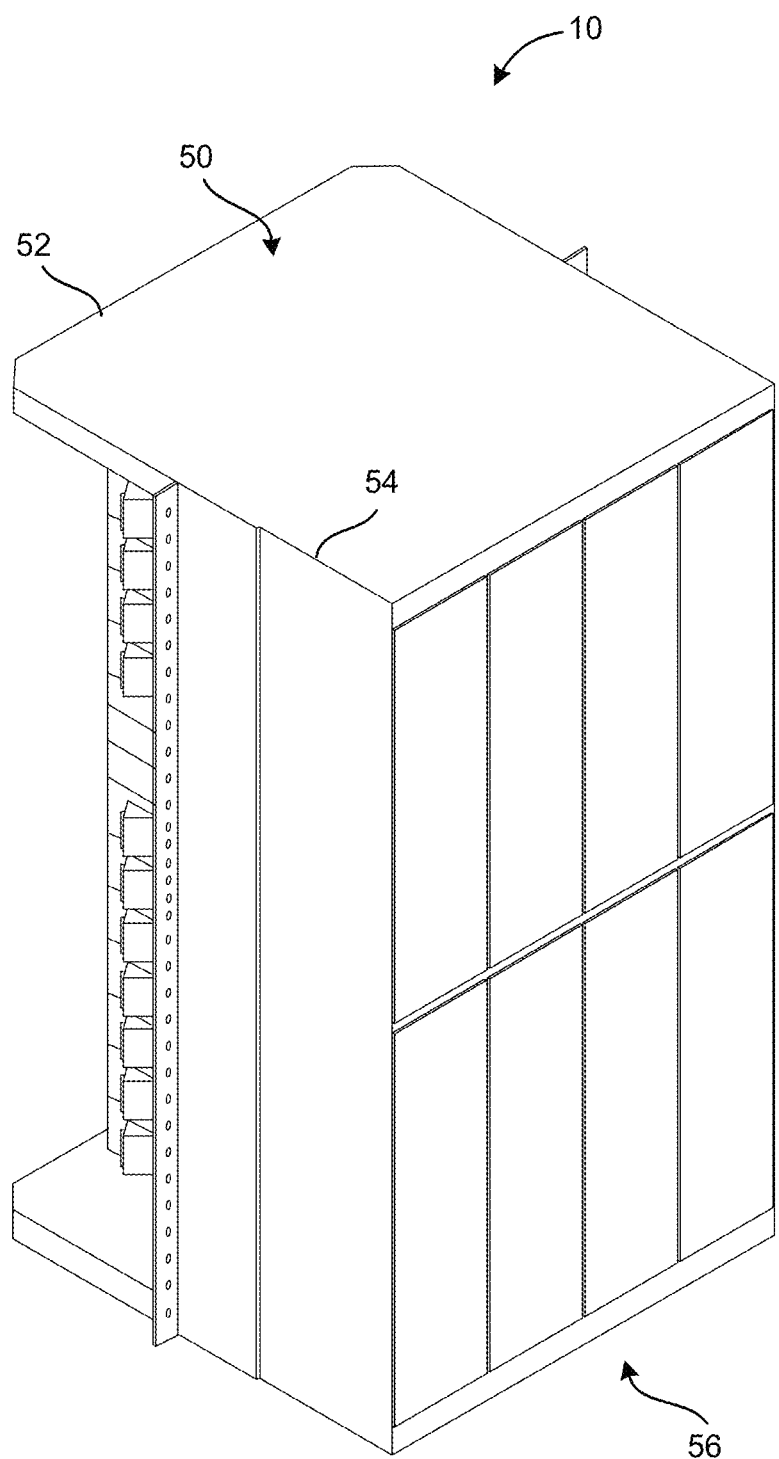
FIG. 3B illustrates a perspective top view of the back of the embodiment of the shelf assembly with the plurality of circuit cards assemblies installed in the vertical stack of FIG. 3A, in accordance with aspects of the present subject matter.

FIG. 3 illustrate perspective top views of the front (FIG. 3A) and back (FIG. 3B) of one embodiment of a shelf assembly of the present disclosure with a plurality of circuit cards assemblies (client boxes 12a and fabric boxes 12b) installed in a vertical stack. As can be seen, the shelf assembly 10 includes a housing 50 and circuit card assemblies 12 that include a front portion 52 and a rear portion 54 of the housing 50 at which the plurality of fans 56 are disposed. From the front, it can be seen that the fabric ports 24 are arranged in a patch panel type of arrangement for fabric cable connections from fabric boxes to client boxes. As shown, the areas at the left and right corners of the front portion 52 of the housing 50 where connections are made allow for easy hand access. As such, in various embodiments, the ports are accessible from the faceplate and side facing corners of the case. Because the ports may include client ports and/or fabric ports, both client ports and/or fabric ports may be accessible from the faceplate and side facing corners of the case, depending on the particular implementation.

In some embodiments, the shelf assembly may include LEDs (not shown) that are visible from the front portion 52 of the housing, where the LEDs indicate proper connection of cables to the ports.

Figure 4A:
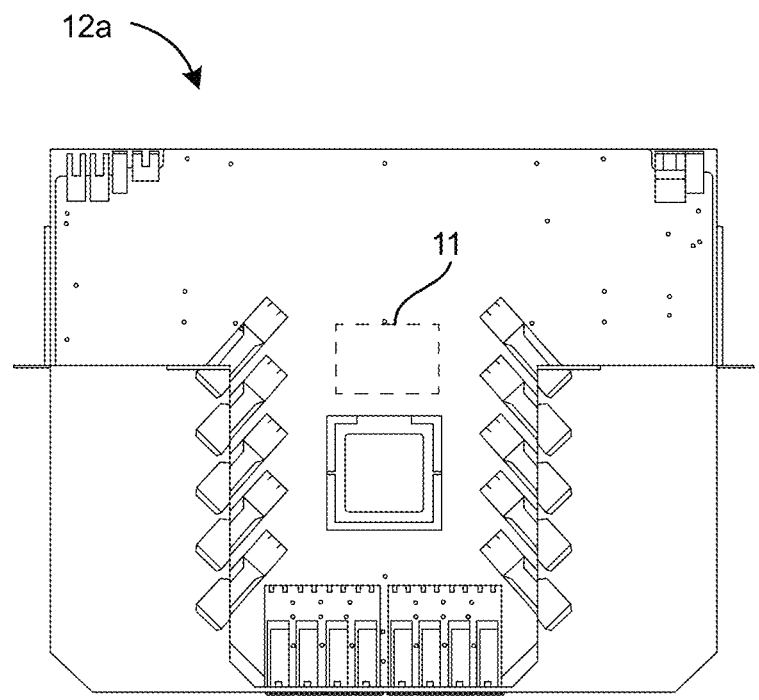
FIG. 4A illustrates top views of an embodiment of a client box circuit card assembly, in accordance with aspects of the present subject matter.
Figure 4A:
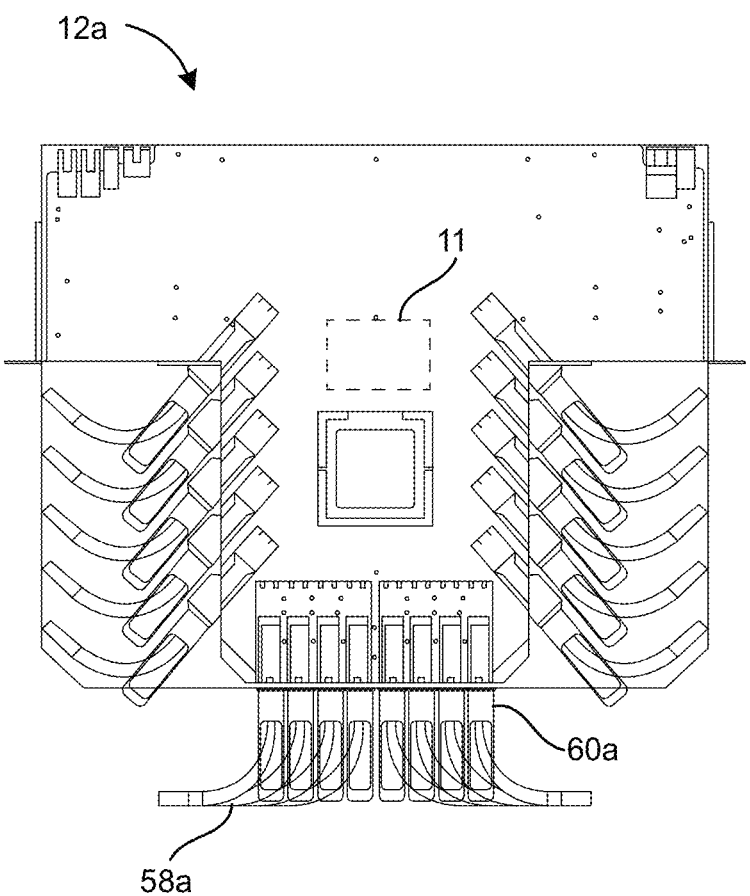
Figure 4B:
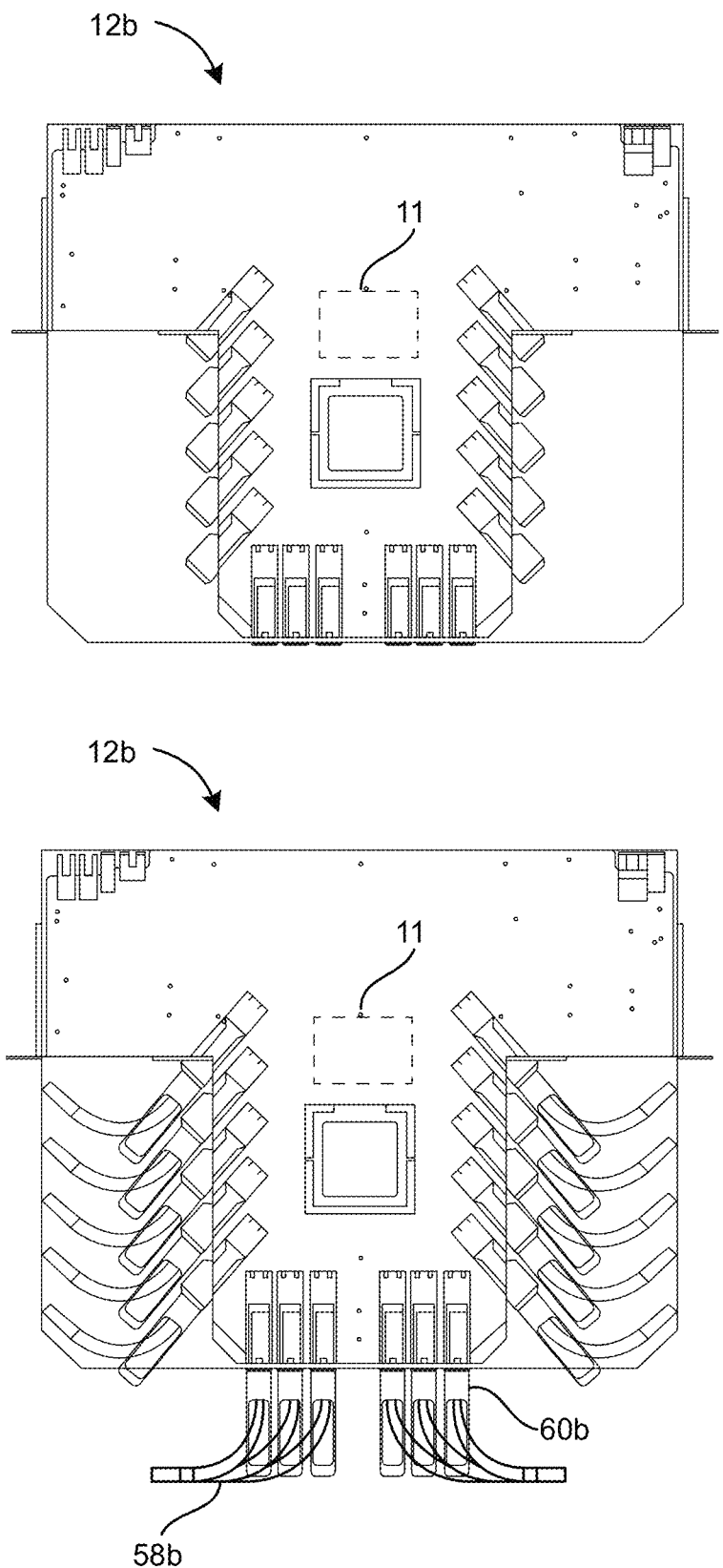
FIG. 4B illustrates top views of an embodiments of a fabric circuit card assembly, in accordance with aspects of the present subject matter.

FIG. 4 illustrate top views of embodiments of circuit cards assemblies of the present disclosure, which include a client box circuit card assembly (FIG. 4A) and a fabric box circuit card assembly (FIG. 4B). As shown, circuit cards assemblies client boxes 12a and fabric boxes 12b at the top of FIGS. 4A and 4B do not have cables currently connected to the ports. The circuit cards assemblies client boxes 12a and fabric boxes 12b at the bottom of FIGS. 4A and 4B have cables 58a and 58b currently connected to the ports. As shown with the circuit cards assemblies client boxes 12a and fabric boxes 12b at the bottom of FIGS. 4A and 4B, the cables are connected to handles 60a and 60b, which are in turn connected to the ports.

Figure 5A:
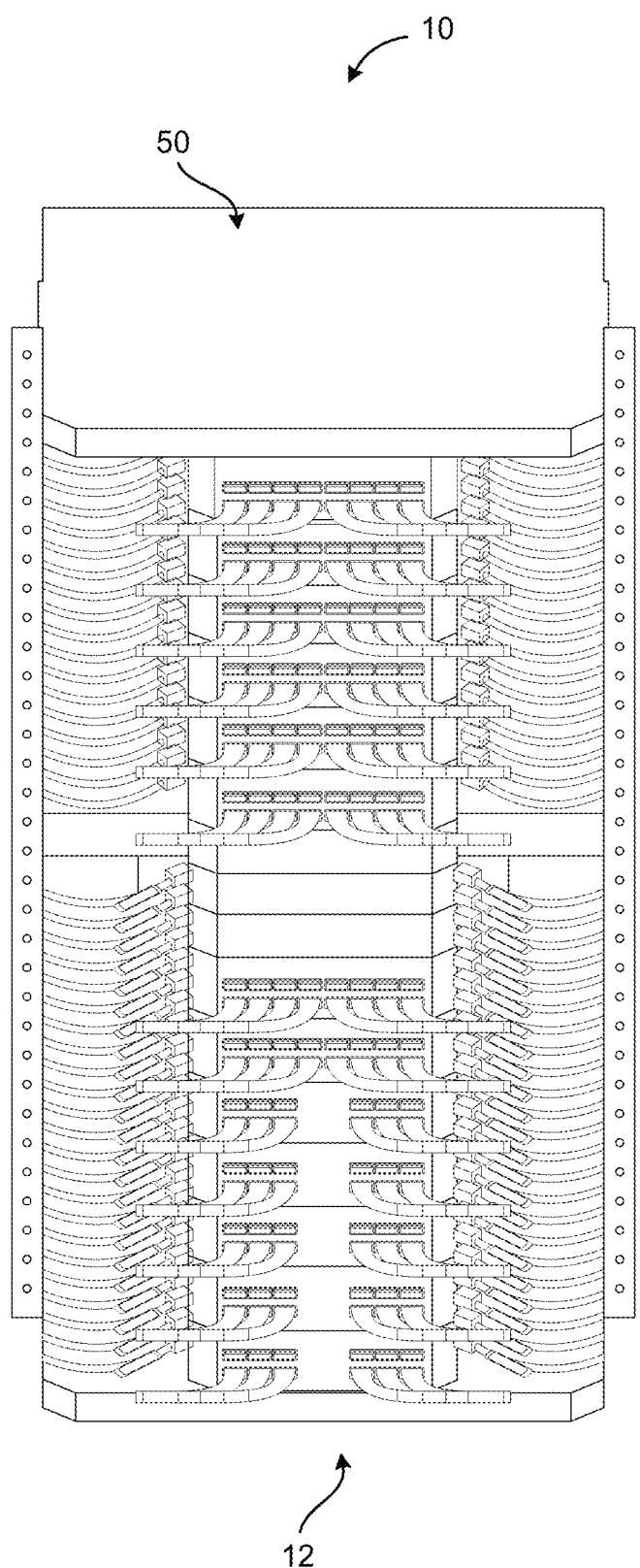
FIG. 5A illustrates a perspective top view of one embodiment of a shelf assembly with a plurality of circuit cards assemblies installed in a vertical stack, in accordance with aspects of the present subject matter.
Figure 5B:
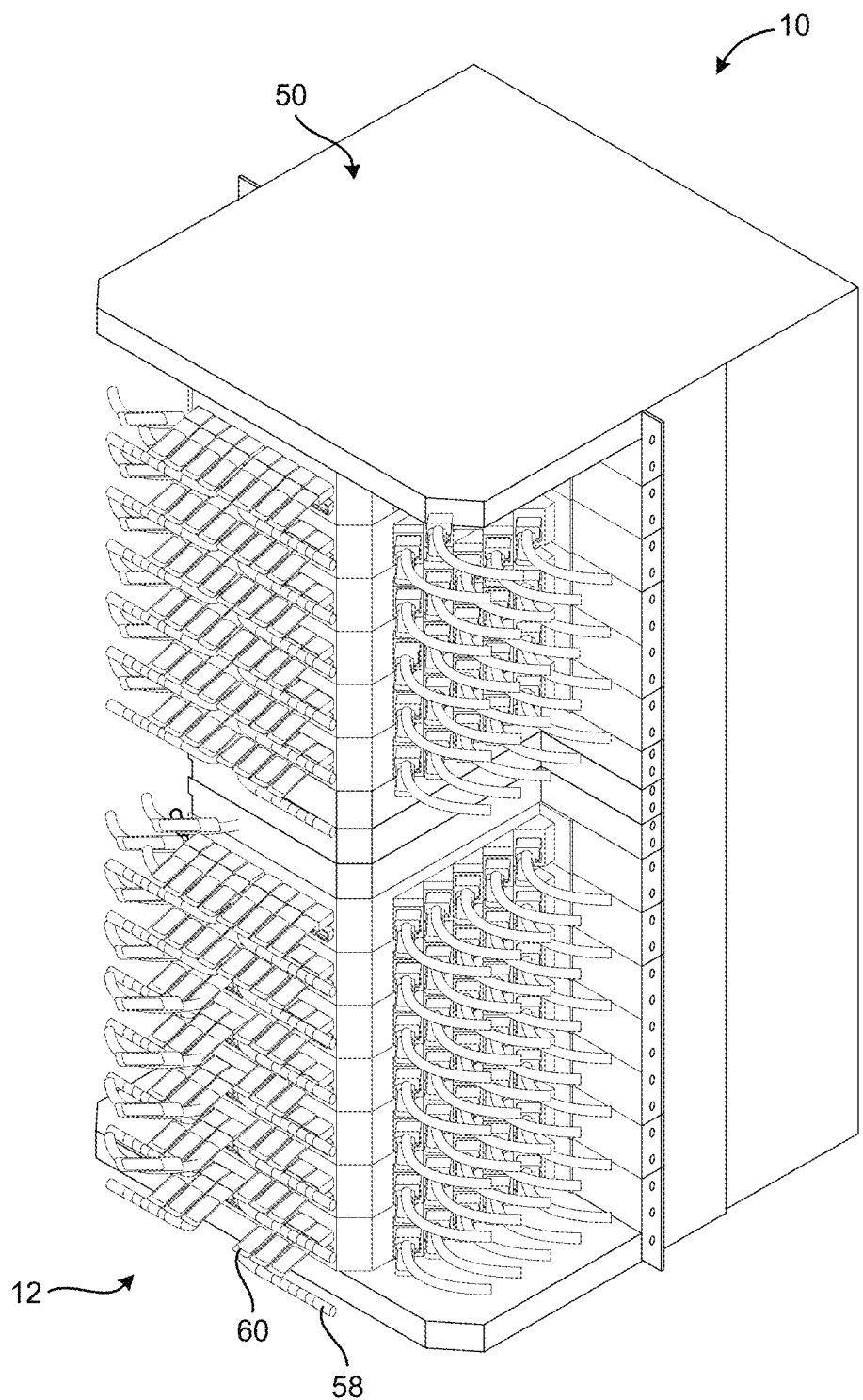
FIG. 5B illustrates a rotated perspective top view of the embodiment of the shelf assembly of FIG. 5A, in accordance with aspects of the present subject matter.

FIG. 5 illustrate a perspective top view (FIG. 5A) and rotated perspective top view (FIG. 5B) of one embodiment of a shelf assembly of the present disclosure with a plurality of circuit cards assemblies installed in a vertical stack. As can be seen, the shelf assembly 10 includes a housing 50 and circuit card assemblies 12. In this example, shelf assembly 10 has cables 58 connected to handles 60, which are in turn connect to ports at cages of the circuit cards assemblies 12. The example may be extended to any electrical/optical interface that uses cages (QSFP, OSFP, SFO, etc.).

Figure 6:
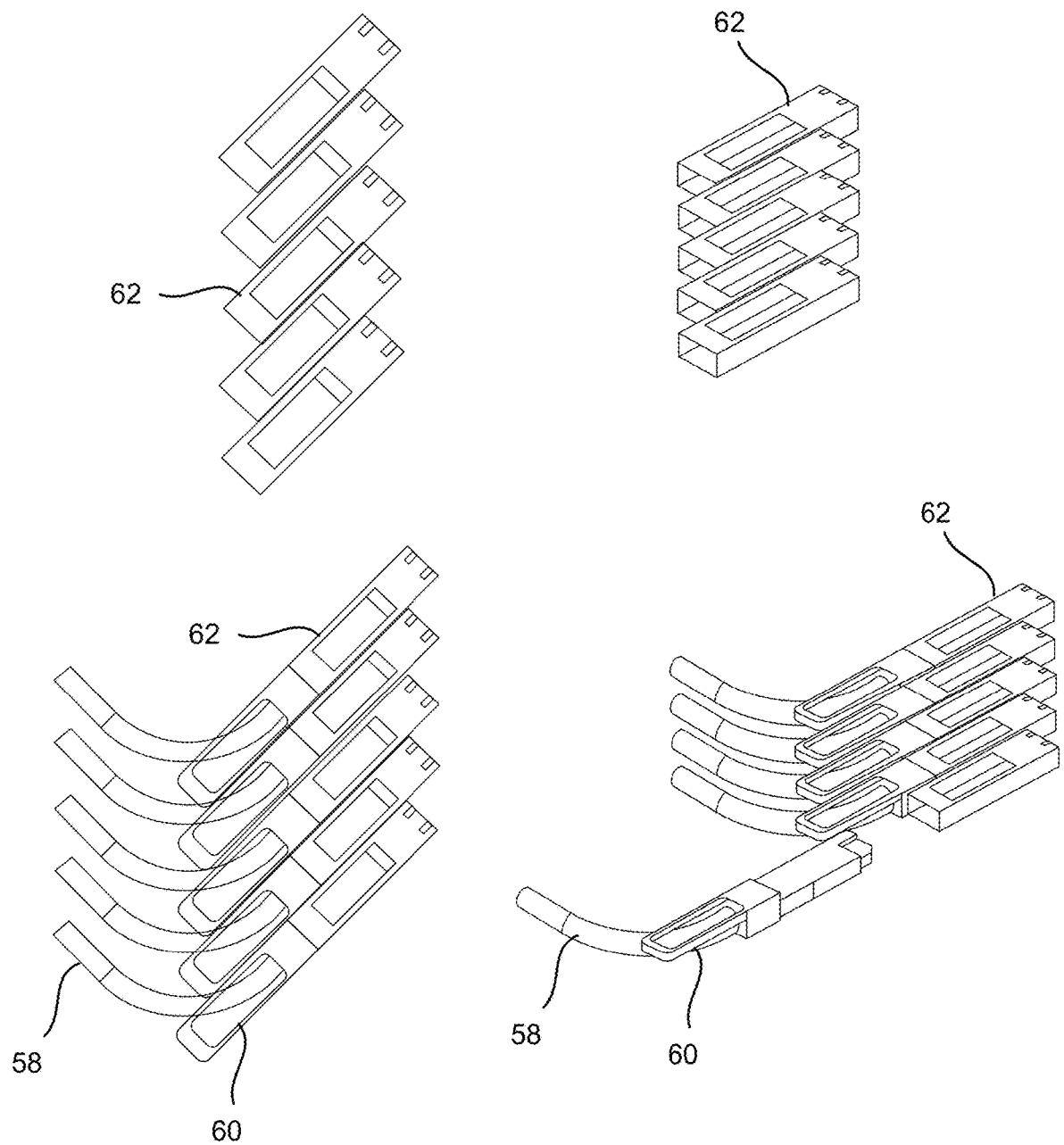
FIG. 6 illustrates top views and perspective views of embodiments of ganged cages without cables attached and with cables attached, in accordance with aspects of the present subject matter.

FIG. 6 illustrates top views and perspective views of embodiments of ganged cages of the present disclosure without cables attached and with cables attached. As shown, ganged cages 62 at the top of FIG. 6 do not have cables currently connected to the ports. The ganged cages 62 at the bottom of FIG. 6A have cables 58 currently connected to the ports of the ganged cages 62. As shown with the ganged cages 62 at the bottom of FIG. 6, the cables 58 are connected to handles 60, which are in turn connected to the ports. Each handle 60 is separate from the other handles 60 and each handle 60 may be connected to a respective cage 62 of the ganged cages 62. Ganged cages 62 are advantageous, because their compact design takes up less faceplate real estate and PCB area. Also, the ganged cages 62 are angled, which allows for much shorter track lengths between the cages 62 and an ASIC chip.

Figure 7:
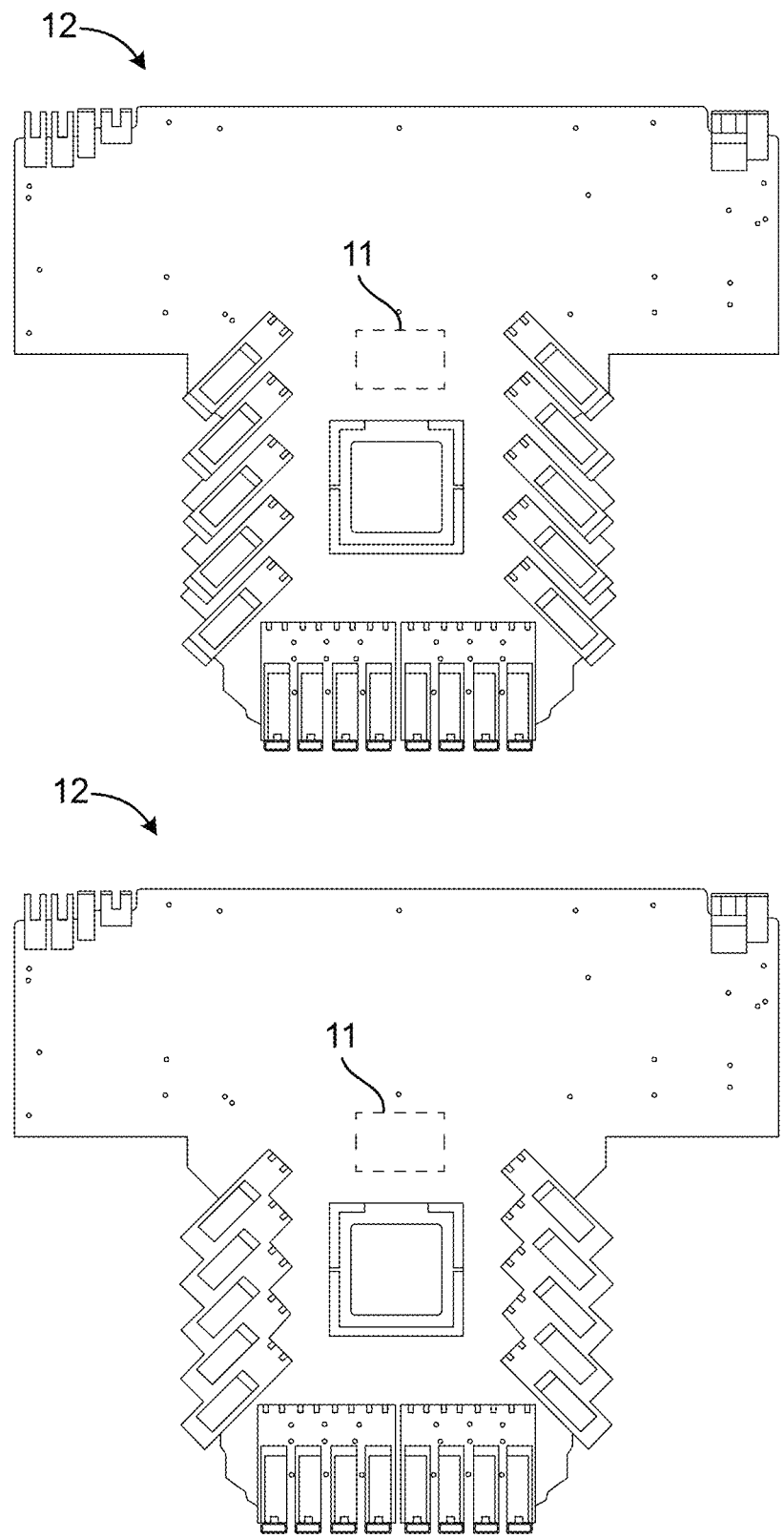
FIG. 7 illustrates top views of embodiments of circuit cards assemblies, in accordance with aspects of the present subject matter.

FIG. 7 illustrates top views of embodiments of circuit cards assemblies of the present disclosure. As shown, the circuit cards assembly 12 on the left of FIG. 7 has cages 62 that are not ganged. The circuit cards assembly 12 on the right of FIG. 7 has ganged cages 62. In both of these examples, the cages 62 whether ganged or not are angled and stepped.

Figure 8:
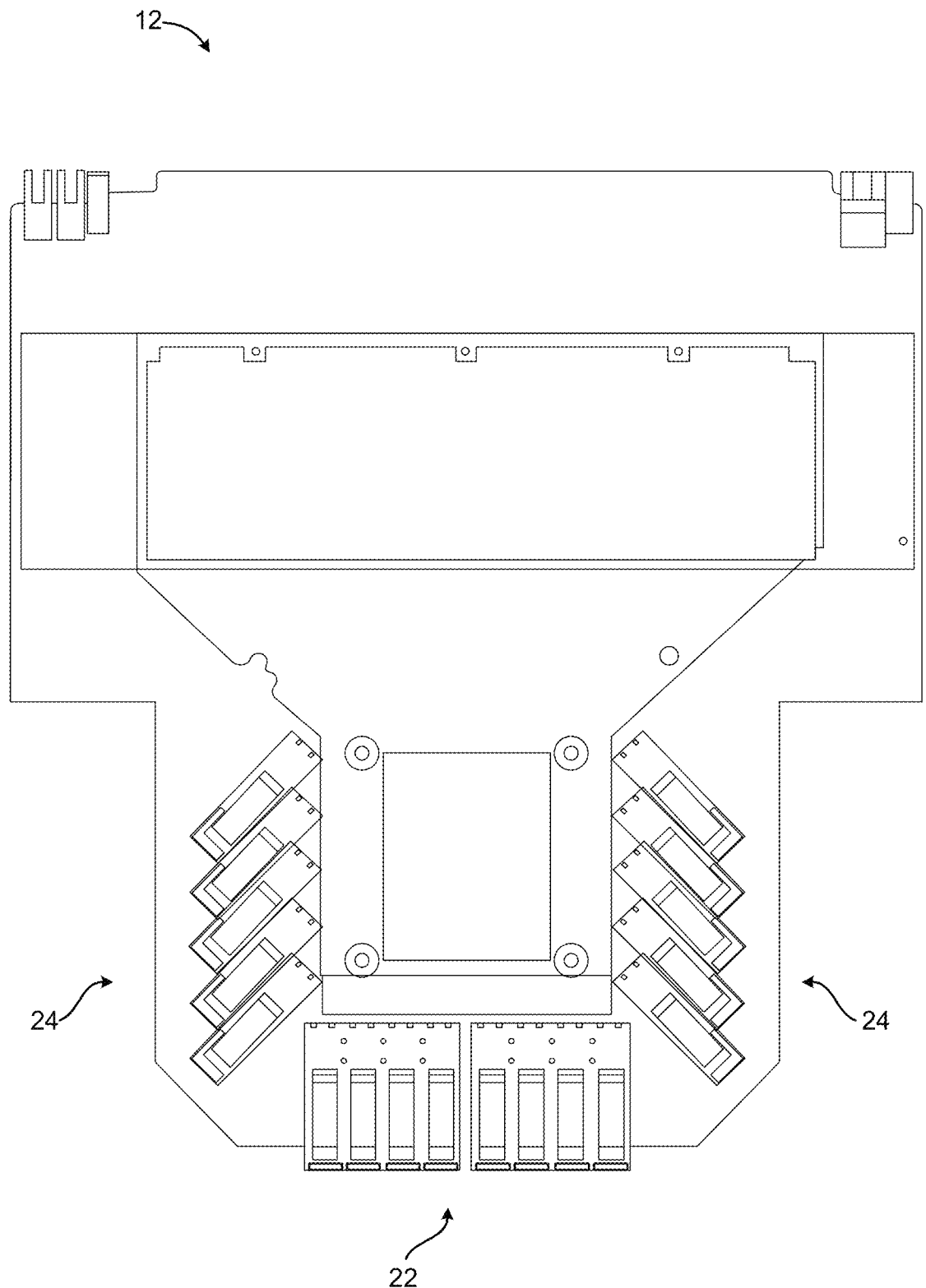
FIG. 8 illustrates a top view of one embodiment of a circuit card assembly layout configured for use with power phases surrounding an associated integrated circuit chip, in accordance with aspects of the present subject matter.
Figure 9:
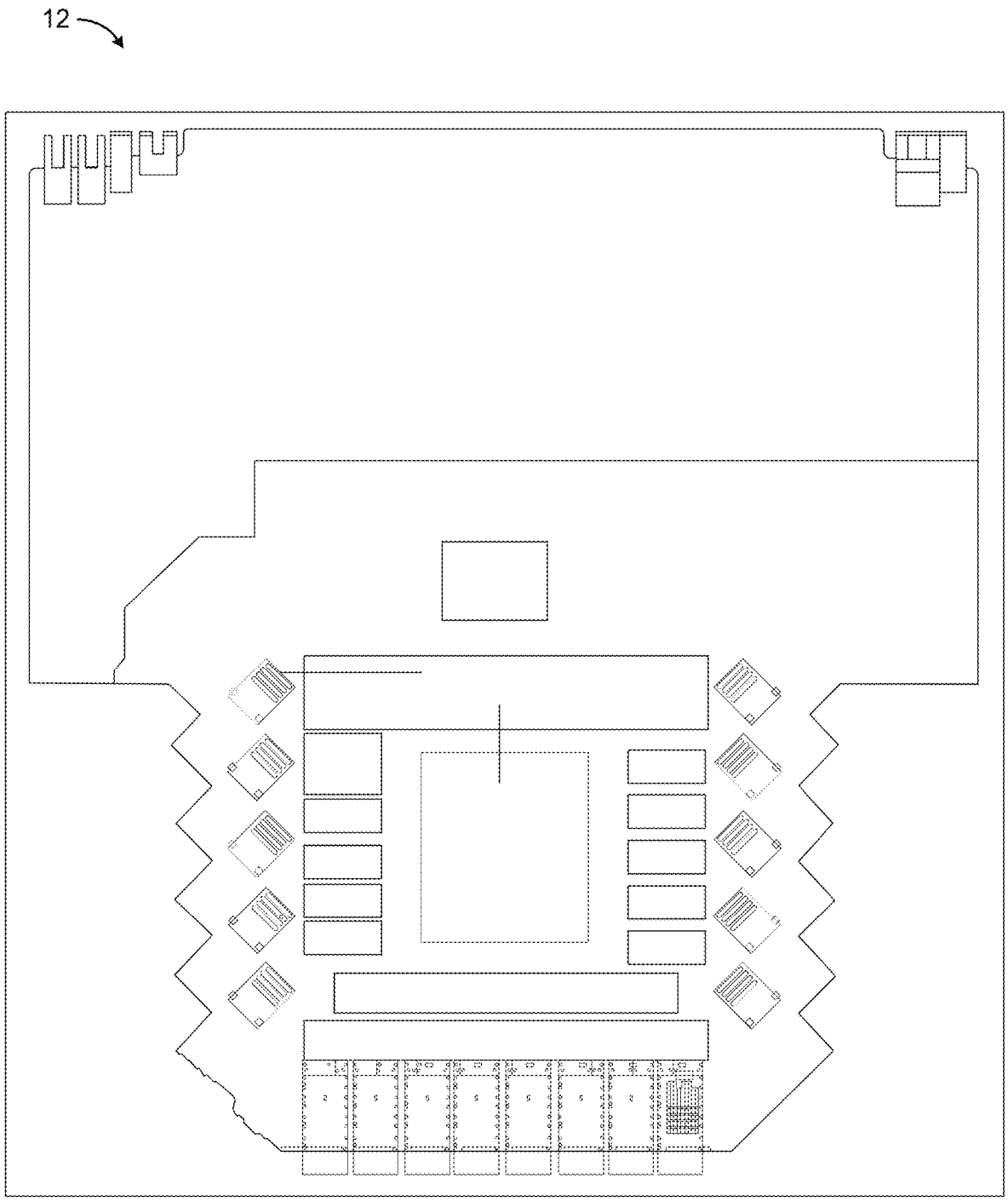
FIG. 9 illustrates a top electrical schematic view of one embodiment of a circuit card assembly with power phases surrounding an integrated circuit chip, in accordance with aspects of the present subject matter.
Figure 10:
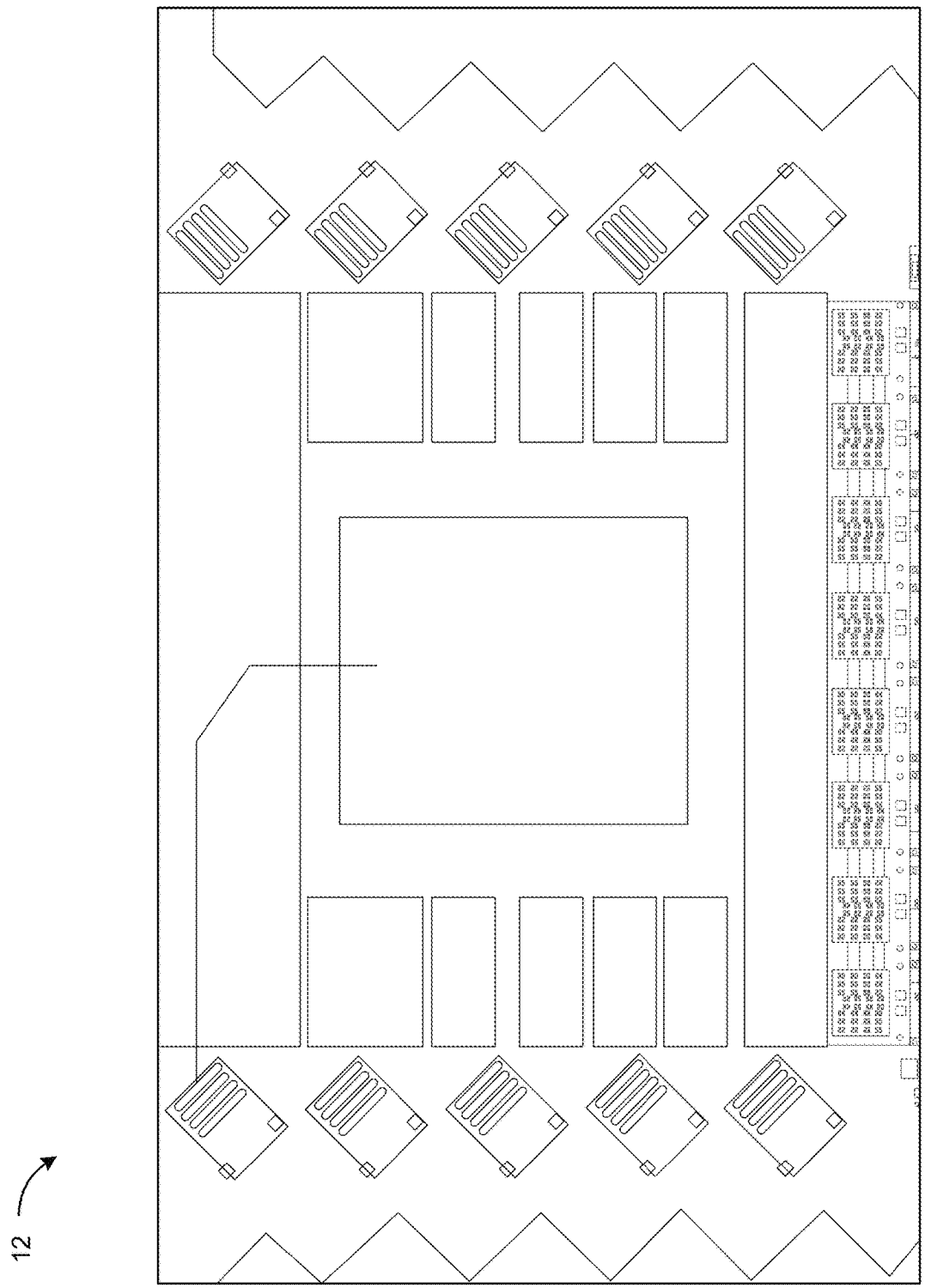
FIG. 10 illustrates a portion of the top electrical schematic view of FIG. 9 showing the power phases surrounding an integrated circuit chip, in accordance with aspects of the present subject matter.

FIGS. 8-10 illustrate top views of embodiments of circuit cards assemblies of the present disclosure. More particularly, FIG. 8 illustrates a schematic top view of the layout of a circuit card assembly configured for use with power phases surrounding an integrated circuit chip, FIG. 9 illustrates a top electrical schematic view of a circuit card assembly with power phases surrounding an integrated circuit chip, and FIG. 10 illustrates a portion of the top electrical schematic view of FIG. 9 showing the power phases surrounding the integrated circuit chip. As shown in FIGS. 9 and 10, typical circuit card assemblies 12 may include a plurality of power phases arranged around a perimeter of the ASIC 18 in order to provide power to the same. A power phase, as user herein, generally refers to a circuit configured to power at least a portion of an integrated circuit chip, ASIC, or the like. Each power phase my include or be associated with one or more transistors, capacitors, inductors, chokes, voltage regulator modules, MOSFETs, or the like, The total power supplied to the ASIC 18 may include a summation of the power supplied by the individual power phases.

As shown in FIGS. 8-10, the power phases surrounding the ASIC 18 substantially limit how close other components of the circuit card assembly 12 may be positioned to the ASIC 18. Thus and as shown in FIG. 8, a significant portion of the PCB 16 of the circuit card assembly 12 is left clear in order to accommodate power phases surrounding a perimeter of the ASIC 18. Referring again generally to FIGS. 8-10, the use of power phases surrounding the perimeter of the ASIC 18 requires that the cages 24 (FIG. 8) of the circuit card assemblies 12 be physically placed outside of the surrounding power phases and results in a longer track length between the cages and the ASIC 18. The longer track length between the cages and ASIC 18 may generally cause greater signal loss and increased noise along the track and hence impacts performance of the ASIC 18 and the respective circuit card assembly 12.

Figure 11:
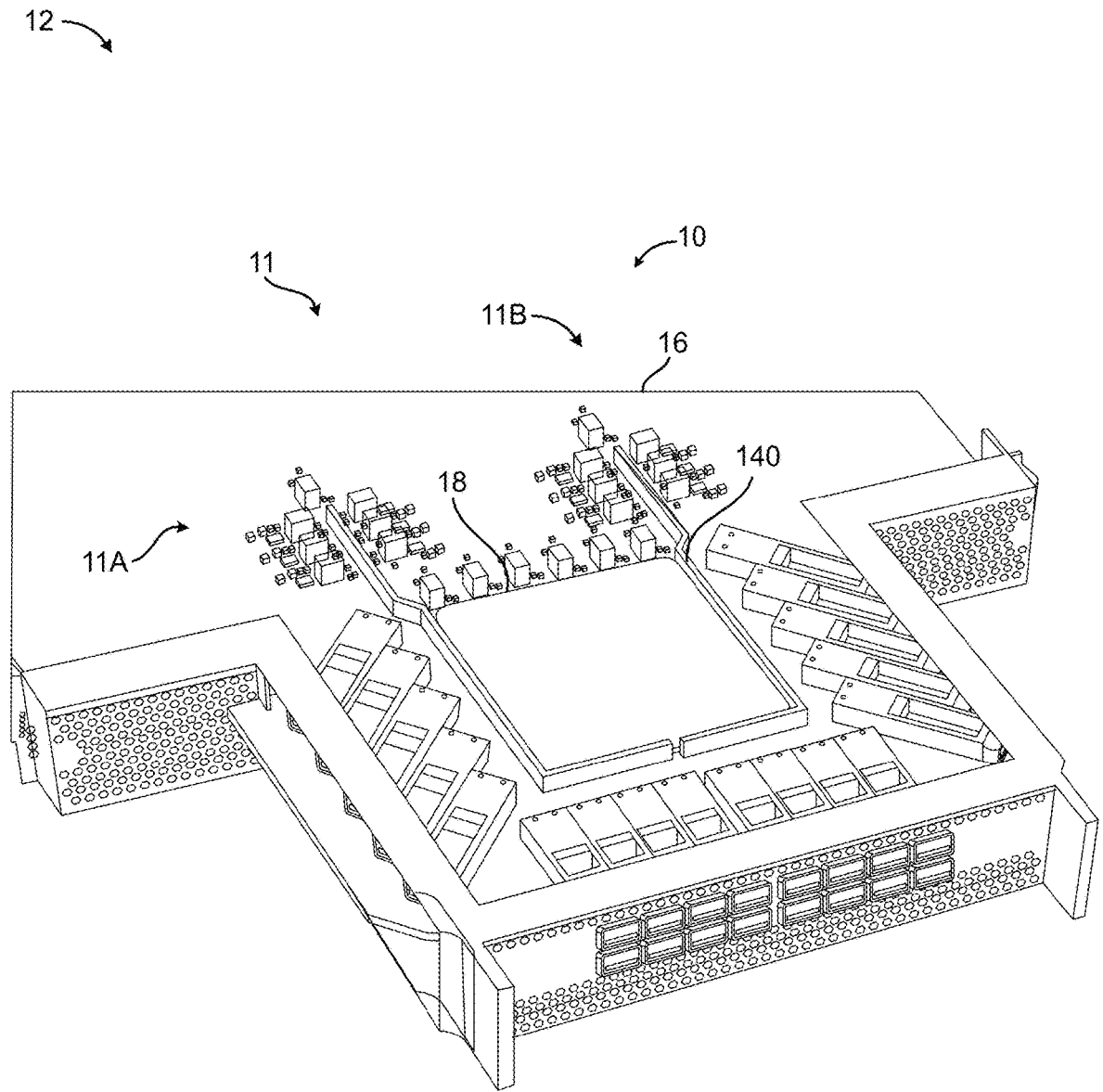
FIG. 11 illustrates a perspective top view of one embodiment of a shelf assembly of the present disclosure with a circuit card assembly including grouped power phases, in accordance with aspects of the present subject matter.

FIG. 11 illustrates a perspective top view of one embodiment of a shelf assembly of the present disclosure with a circuit card assembly including grouped power phases. As shown, an ASIC 18 is disposed on the PCB 16 of circuit card assembly 12 associated with the shelf assembly 10. In various embodiments, one or more busbars 140 are coupled to the PCB 16 and disposed conformally around at least a portion of the perimeter of the integrated circuit chip 18 or ASIC 18 in order to communicatively couple power phases physically distanced from the ASIC 18 (e.g., grouped power phases 11) to the ASIC 18. The space between the cages and ASIC 18 allows for ample room for the busbar(s) 140 to be disposed around the perimeter of the ASIC 18. The busbar(s) 140 enables additional connections between the ASIC 18 and other circuitry on the PCB 16, such as the grouped power phases 11. As shown in the depicted embodiments, the circuit card assemblies 12 may be configured as client boxes 12a including client ports 22, as described herein. However, it should be appreciated that the disclosed circuit card assemblies 12 with grouped power phases 11 may be equally applicable to fabric boxes 12b and/or any suitably configured circuit card assembly or circuit pack where additional physical space surrounding an application specific integrated circuit and/or an integrated circuit chip is desired or required. Additionally or alternatively, the examples may be extended to any electrical/optical interface that uses cages (QSFP-DD, QSFP, OSFP, SFO, etc.). It should also be appreciated that the disclosure herein is equally applicable to circuit assemblies where additional space around an integrated circuit is desired or required, such as aerospace circuit assemblies, military circuit assemblies, and the like.

As shown, the grouped power phases 11 may generally allow such power phases to be physically distanced from or located further from the ASIC 18. For example, power phases communicatively coupled to one or more sides of the ASIC 18 may be positioned proximate to one side of the ASIC 18 and communicatively coupled to the correct physical location on the ASIC 18 utilizing one or more busbars 140. In the depicted embodiment, power phases associated with three sides of the ASIC 18 are positioned together as the grouped power phases 11 proximate to a fourth side of the ASIC 18 in order to free up the physical space surrounding the three sides of the ASIC 18. A physically distanced power phase, as used herein, is a power phase positioned some distance from the associated integrated circuit chip and communicatively coupled to the integrated circuit chip utilizing an intermediate component, such as a busbar 140 as described herein. A physically distanced power phase may be physically located farther from the side of the ASIC 18 communicatively coupled to the physically distanced power than another side of the ASIC 18. Thus, a physically distanced power phase may be located closer to another side of the ASIC 18 than the side of the ASIC 18 powered by the physically distanced power phase. For example, the physically distanced grouped power phases 11 may be positioned past a plane defined by the top edge of the ASIC 18.

As shown and in some embodiments, the power phases associated with each respective side may be grouped together as subgroups of the grouped power phases 11 (e.g., a first subgroup 11A of power phases positioned at the top left of the PCB 16 and a second subgroup 11B of power phases positioned at the top right of the PCB 16 in FIG. 11). Generally, a subgroup of the grouped power phases may include two or more power phases located in close proximity or otherwise physically positioned together to define distinct groupings of the power phases. For example, a subgroup of power phases may be arranged in close proximity and coupled to the same busbar 140 for communication with the ASIC 18.

In the depicted embodiment, power phases associated with the fourth side may be located along such fourth side (e.g., the top side of FIG. 11) as there are no cages positioned along the top side of the ASIC 18 in the embodiment of FIG. 11. In additional or alternative embodiments, power phases associated with only two sides or one side may be positioned with the grouped power phases 11. Furthermore, power phases associated with additional sides (e.g., a fourth side, a fifth side, and/or a sixth side, etc. up to all the sides of the ASIC 18) may be positioned with the grouped power phases 11. In some embodiments, all of the power phases of the grouped power phases 11 associated with a side of the ASIC 18 may be arranged as subgroup (e.g., first subgroup 11A, second subgroup 11B, etc.) dedicated for power management of the associated side of the ASIC 18. In some embodiments, each side of the ASIC 18 may be associated with a subgroup of the grouped power phases 11. In some embodiments, one or more subgroups of the grouped power phases 11 may include power phases associated with different sides of the ASIC 18. For example, first subgroup 11A includes power phases associated with the left side and the bottom side of the depicted ASIC 18. Generally, power phases are relatively tall and large components as compared to other typical components of circuit card assemblies 12 and limit the design of such circuit card assemblies 12. For example, heat-sink fins are often placed in the vertical space under an associated heat-sink to maximize heat transfer, but large and/or tall power phases surrounding the permitter of the ASIC 18 prevent the use of such heat-sink fins over the ASIC 18 or limit the vertical space and thus the size of heat-sink fins that may be used. By placing the grouped power phases 11 away from the ASIC 18 (rather than surrounding the perimeter of the ASIC 18) the vertical space above the ASIC 18 may be increased to accommodate additional or larger heat-sink fins or thicker baseplate and/or vapor chamber thicknesses.

The busbar(s) 140 may be cut such that each busbar 140 has pins that may be soldered directly onto the PCB 16 with periodic spacing in order to provide a short path for current to flow from busbar 140 to PCB power plane and then to chip balls. In additional or alternative configurations, each busbar 140 may be connected to the PCB 16 utilizing one or more connector contacts allowing a separable interface between the respective busbar 140 and the PCB 16 and/or through mechanical attachment to one or more exposed pads provided on the PCB 16. In the depicted embodiment, two busbars 140 are provided to couple portions of the grouped power phases 11 to associated sides of the ASIC 18. For example, the first subgroup 11A (e.g., top left subgroup) of the grouped power phases 11 associated with the left side of ASIC 18 may be electronically coupled to the left side of the ASIC 18 using a first busbar 140, and the second subgroup 11B (e.g., top right subgroup) of the grouped power phases 11 associated with the right side of ASIC 18 may be electronically coupled to the right side of the ASIC 18 using a second busbar 140. In the illustrated embodiment, power phases associated with the bottom side of ASIC 18 are split between the first subgroup 11A and the second subgroup 11B of the grouped power phases 11, and the first and second busbars 140 are each communicatively coupled to a corresponding portion of the bottom side of ASIC 18.

In some embodiments including multiple busbars 140, each busbar 140 may be provided with the same or approximately the same current. In embodiments where some power phases are positioned along the associated side of the ASIC 18 (e.g., hung from, fixed, attached, or the like), such ungrouped power phases may collectively provide the same or approximately the same current as the provided to each busbar 140. For instance, in the embodiment of FIG. 11, the first busbar 140 may communicate a third of the total current of the ASIC 18 provided by the first subgroup 11A of the grouped power phases 11; the second busbar 140 may communicate a third of the total current of the ASIC 18 provided by the second subgroup 11B of the grouped power phases 11, and the power phases positioned along the top edge of the ASIC 18 my provide the last third of the total current of the ASIC 18.

In additional or alternative embodiments, each side of the ASIC 18 may be communicatively coupled to the associated power phases of the grouped power phases 11 utilizing a dedicated busbar 140. Furthermore, one busbar 140 may be configured to communicatively couple all of the power phases of the grouped power phases 11 associated with two or more sides of the ASIC 18 to the associated sides of the ASIC 18. Furthermore, some embodiments of the circuit card assembly 12 may include a single busbar 140 communicatively coupling all of the power phases of the grouped power phases 11 to the ASIC 18. For example, a single U-shaped busbar may couple the grouped power phases 11 to each of the left side, the bottom side, and the right side of the ASIC 18. Additionally or alternatively, one or more busbars 140 may also be configured to also act as a stiffener for the associated the ASIC 18. For example, a single U-shaped busbar that couples all of the grouped power phases 11 to the ASIC 18 may also function as a stiffener for the ASIC 18. A busbar 140 configured as a stiffener at least partially supports the ASIC 18 relative to the PCB 16. A busbar(s) 140 that also acts as a stiffener may be particularly advantageous for large ASICs 18.

For calculation purposes, the current communicated through each busbar 140 may be an average current for the length of the busbar 140 that surrounds the ASIC 18 since there is progressively less current (and thus voltage drop) along its length as the ASIC 18 consumes current. The height and thickness of the busbar(s) 140 may be adjusted to provide the required resistance for the length of the busbar(s) 140 (e.g., a one cm length of copper busbar 140 that is 0.85 cm wide and 0.2 cm thick may have a resistance of approximately 10.14 uOhms at 20 degrees Celsius). An exemplary calculation of the voltage provided by a right-side busbar 140 is shown below, where the right-side busbar length is 20 cm, the total ASIC 18 current is 780 A, and the resistance of the right-side busbar 140 is 10 uOhms/cm:

$$[780 * 33\% * 10 \text{ uOhm/cm} * 10 \text{ cm}] + [$$
$$(129 A \text{ average}) * 10 \text{ uOhm/cm} * (10 \text{ cm})] = 39 \text{ mV}$$

Some embodiments of the busbar(s) 140 may be configured as a dual layer busbar where both power and its return path are placed adjacent to each other. It should be appreciated that the power path and return path may be electrically isolated from one another. A dual layer busbar avoids use of the PCB 16 copper for the return path, which is associated with increased ground noise and EM emissions. Thus, a dual layer busbar results in less current returned through the PCB 16 in order to define a smaller loop area such that the opposing currents effect will also reduce PDN loop inductance. Furthermore, it should be appreciated that some PCBs 16 are not suitable to and/or cannot deliver the current or return current associated with the ASIC 18 and power phase(s) connection.

The use of one more busbars 140 coupled to grouped power phases 11 positioned away from respective sides of an ASIC 18 may generally reduce the complexity of the associated circuit card assembly 12. By simplifying the design of the associated circuit card assembly 12, fewer layers may be required for the PCB 16 and/or cheaper materials may be utilized. Furthermore, simplifying the circuit card assembly 12 may increase the number of fabricators able to provide a suitable PCB 16, further reducing costs and potentially increasing production rates.

Figure 12:
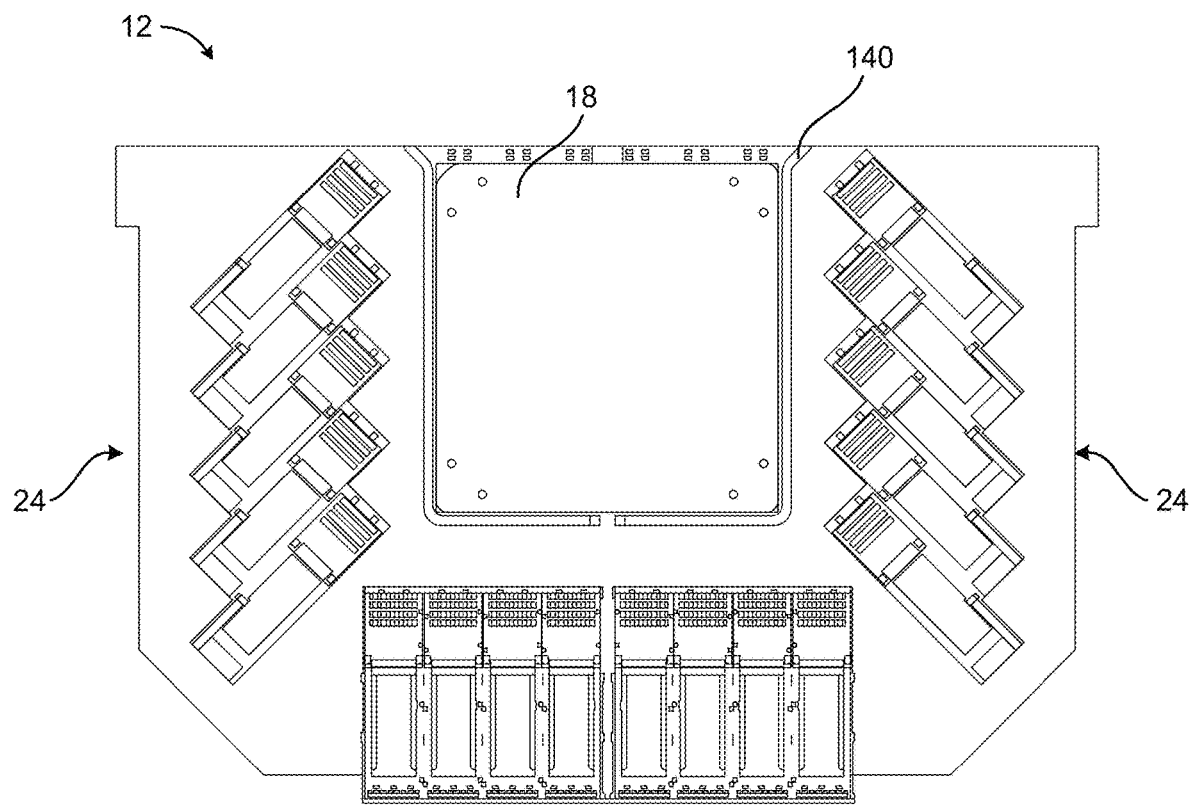
FIG. 12 illustrates a top view of one embodiment of a circuit card assembly showing an ASIC with busbars configured to couple to grouped power phases, in accordance with aspects of the present subject matter.

FIG. 12 illustrates a top view of one embodiment of a circuit card assembly showing an ASIC with busbars coupled to grouped power phases. As shown, the busbars 140 couple the ASIC 18 to grouped power phases 11 (omitted from FIG. 12) positioned a distance away from the ASIC 18 on the PCB 16, such as proximate to the top side of the ASIC 18 as described with reference to FIG. 11 above. In the depicted embodiment, the cages 24 may be placed substantially closer to the ASIC 18 due to the fact that the power phases associated with the ASIC 18 have been placed on the PCB 16 at a physical location other than surrounding the ASIC 18. More particularly, the cages 24 may be placed as close as possible to respective side(s) of the ASIC 18 and/or the associated busbar(s) 140. It should be appreciated that the cages 24 of FIG. 12 are positioned much closer to the sides of ASIC 18 than the embodiment depicted in FIG. 8 due to the busbars 140 that communicatively couple the ASIC 18 to the grouped power phases 11 positioned at a location that does not impact the placement of the cages 24, such as physically distanced, as used herein, proximate to the top side of ASIC 18 as shown in FIG. 11, or, alternatively, another free space of the PCB 16 distanced from the ASIC 18.

Figure 13:
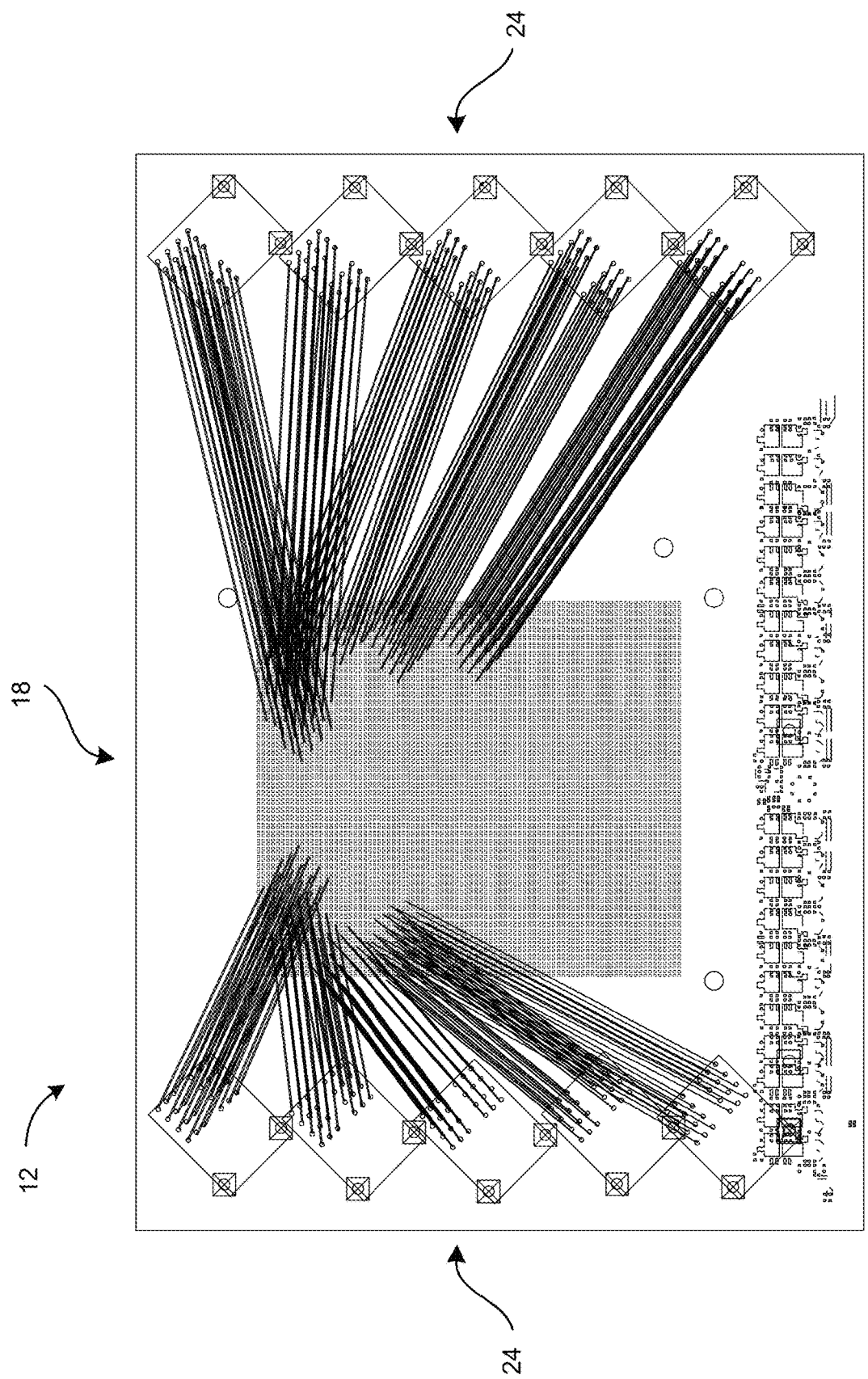
FIG. 13 illustrates a top electrical schematic view of one embodiment of a circuit card assembly utilizing grouped power phases showing signal tracks between cages and an ASIC, in accordance with aspects of the present subject matter.
Figure 14:
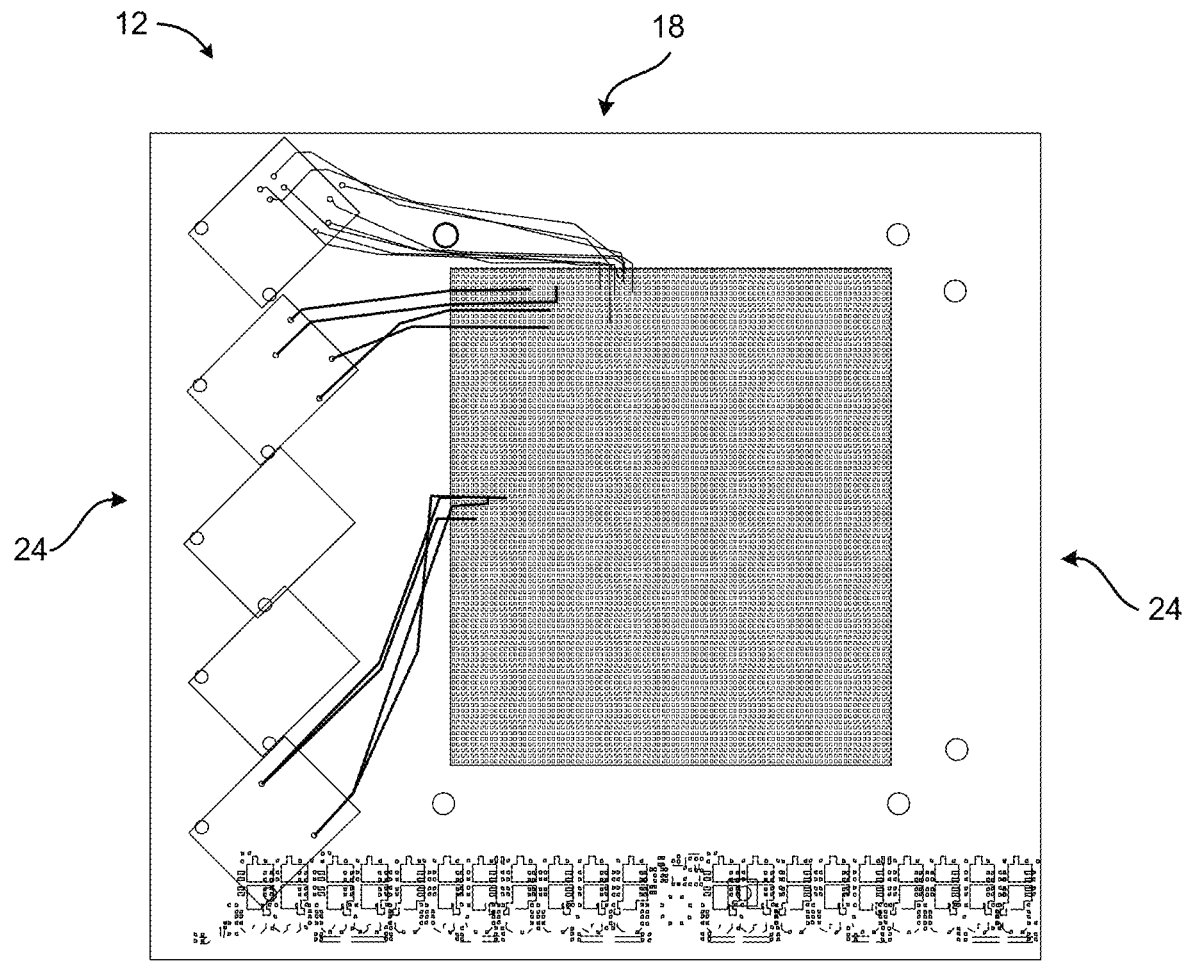
FIG. 14 illustrates a top electrical schematic view of one embodiment of a circuit card assembly utilizing grouped power phases showing track lengths of signal tracks between cages and an ASIC, in accordance with aspects of the present subject matter.

Referring now to FIGS. 13 and 14, top views of electrical schematic diagrams of circuit card assemblies utilized with grouped power phases are illustrated in accordance with aspects of the present disclosure. More particularly, FIG. 13 illustrates a top view of signal tracks between cages 24 and the ASIC 18 on the left side used in conjunction with a busbar 140 and grouped power phases 11, as described herein, and signal tracks between cages 24 and the ASIC 18 on the right side with the power phases associated with the right side positioned on the right side. As shown, the cages 24 on the left side may be positioned substantially closer to the left side of the ASIC 18 due to the power phases being grouped and physically located at a more convenient location on the PCB 16, such as grouped power phases 11 positioned proximate to the top side of the ASIC 18 as described with reference to FIGS. 11 and 12. For example, each cage 24 may be positioned within one inch of the side of the ASIC 18 associated with the cage 24, such within 0.7 inches of the side of the ASIC 18 associated with the cage 24, such as approximately 0.65 inches. Contrarily, the cages 24 on the right side of the ASIC 18 of FIG. 13 must be placed farther from the ASIC 18 in order to accommodate power phases hanging or otherwise fixed to the right side of the ASIC 18.

FIG. 14 illustrates a top view of the track lengths of signal tracks between cages and an ASIC used in conjunction with a busbar and grouped power phases. For example, the track lengths may generally represent the lengths of signal tracks on the left side of FIG. 13. As shown, the track lengths between cages 24 and the ASIC 18 may be minimized when the power phases associated with the left side of the ASIC 18 have been moved to a more convenient location (e.g., grouped power phases 11 positioned proximate to a top side of the ASIC 18 and communicatively coupled to the left side of the ASIC 18 using the busbar(s) 140). For example, the track lengths for each of the signal tracks of FIG. 14 may be less than three inches. It should be appreciated that the resulting shorter track lengths of the signal tracks may allow for lower noise in the communication with the cages 24 (such as in conjunction with QSFP-DDs, Linear-Drive Optics, and/or Linear-Drive Copper), less power consumption, and/or increase the reach of associated SerDes.

Figure 15:
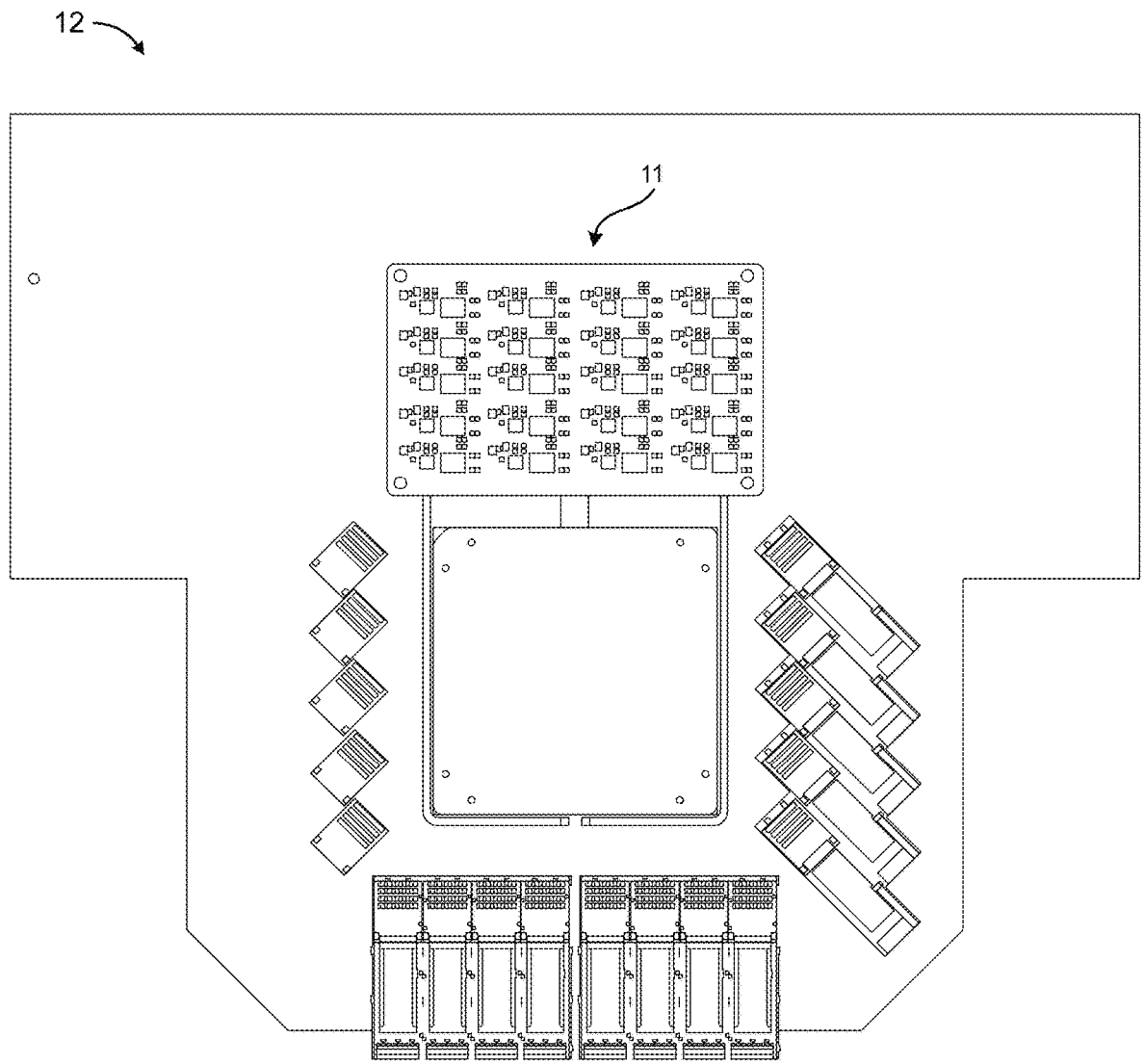
FIG. 15 illustrates a top view of one embodiment of a circuit card assembly with grouped power phases configured as a separate power phase card, in accordance with aspects of the present subject matter.
Figure 16:
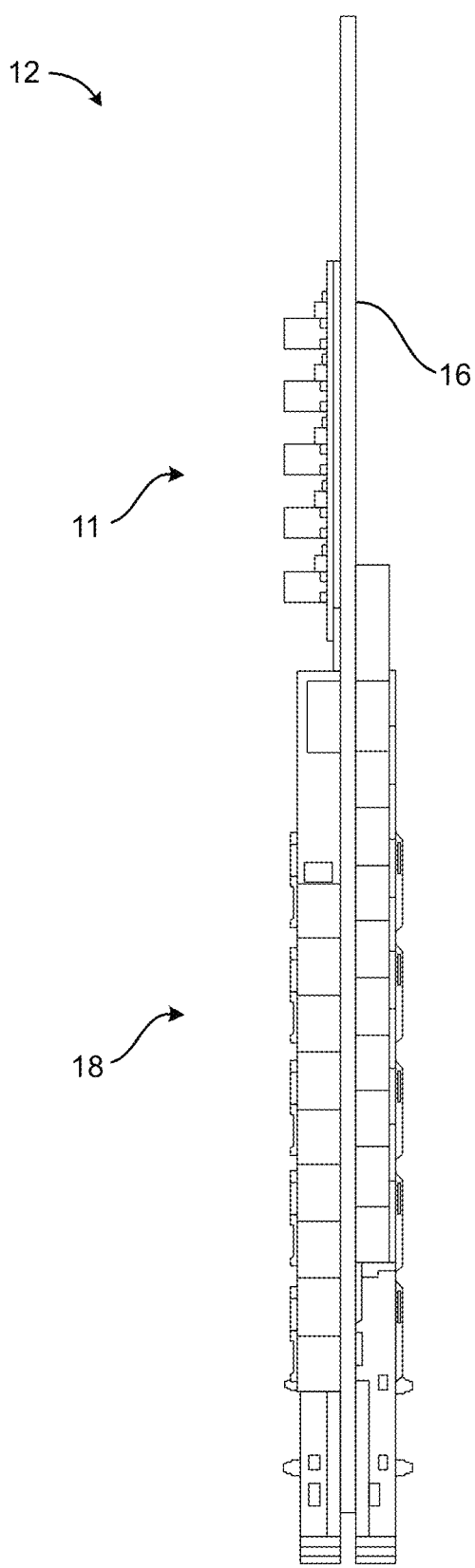
FIG. 16 illustrates a side view of one embodiment of a circuit card assembly with grouped power phases configured as a separate power phase card, in accordance with aspects of the present subject matter.

FIG. 15 illustrates a top view of one embodiment of a circuit card assembly with grouped power phases configured as a separate power phase card in accordance with aspects of the present disclosure, and FIG. 16 illustrates a side view of one embodiment of a circuit card assembly with grouped power phases configured as a separate power phase card in accordance with aspects of the present disclosure. Thus and as shown, the grouped power phases 11 are included in a power phase card with its own power card busbar (omitted) configured to communicate the power, current, etc. from the grouped power phases 11 of the power phase card. The power phase card (e.g., the power card busbar thereof) may be communicatively coupled to the ASIC busbars(s) 140 in order to power the ASIC 18. In some embodiments, the power card busbar may be communicatively coupled to the side of the ASIC 18 closest to the power phase card. However, in other embodiments of the circuit card assembly 12, each side of the ASIC 18 may be powered via one or more ASIC busbars 140, which themselves receive power from the power card busbar of the power phase card.

By placing the grouped power phases on a dedicated power phase card, the vertical space over the PCB 16 may generally be freed up. As shown in FIG. 16, the vertical height of the power phases on the power phase card is greater than the other components of the circuit card assembly 12, such as the cages 24. Thus, positioning the grouped power phases 11 and/or power phase card away from the ASIC 18 (e.g., placed away from one or more sides of the ASIC 18, such as away from three sides of the ASIC 18, such a proximate to one side of the ASIC 18) frees up the vertical space above the ASIC 18. The freed-up space above the ASIC 18 may be used for other components such as additional or larger heat-sink fins or thicker baseplate and/or vapor chamber thicknesses.

Furthermore, the power phase card may be configured with space under the power phase card to position other components of the circuit card assembly 12. The power card busbar configured to provide power to the ASIC busbar(s) 140 generally allows for easy decoupling of the power phase card. It should be appreciated that positioning the grouped power phases 11 on the power phase card allows for simple removal and replacement of the power phase card when there is a power phase failure. Moreover, if future power phases are more efficient, are smaller, or provide other advantages over the power phases of an installed power phase card, the installed power phase card may be easily swapped out for a power phase card including the improved power phases.

Figure 17:
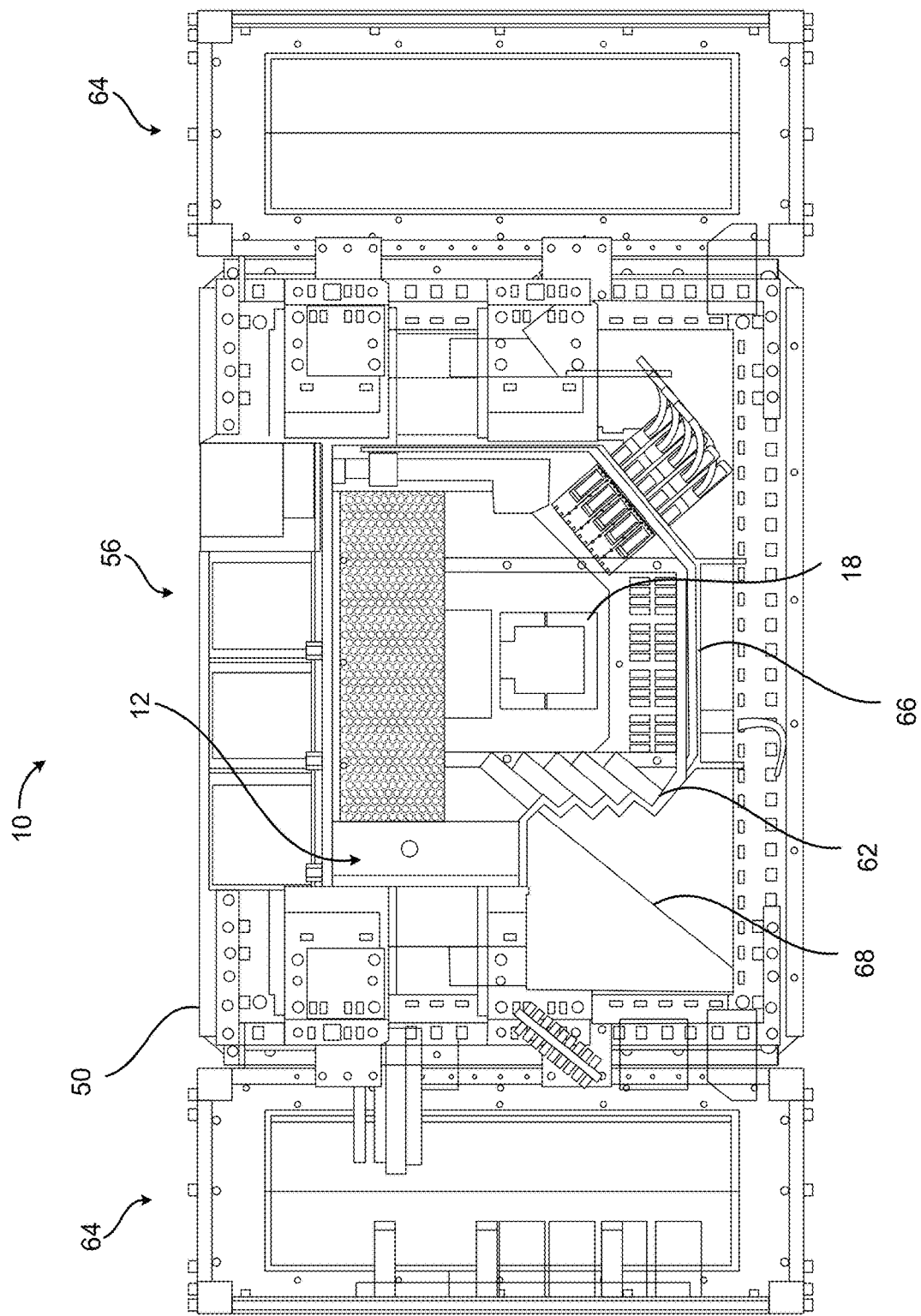
FIG. 17 illustrates a perspective top view of one embodiment of a shelf assembly, in accordance with aspects of the present subject matter.

FIG. 17 illustrates a perspective top view of one embodiment of a shelf assembly of the present disclosure. As can be seen, the shelf assembly 10 includes a housing 50, a circuit card assembly 12, and fans 56. The shelf assembly 10 may also include fiber and cable management bays 64. In various embodiments, there may be multiple shelf assemblies side-by-side in a rack system, where two shelf assemblies may share a cable management bay 64 that is sandwiched between the two shelf assemblies.

Also shown is an ASIC 18, a front faceplate 66, and cages 62. The front faceplate 66 with the group of the cages 62 may be a predetermined width that is approximately similar to or somewhat wider than the width of the ASIC 18. This allows for an ample amount of space or distance between the cages and the side of the housing 50. In indicated herein, the angled and stepped cages 62 have a placement at a 45-degree angle to the front faceplate 66 on both the left and right sides of the ASIC 18. The particular angle of the of cages 62 may vary, depending on the particular implementation.

As shown, the cages 62 being angled and stepped are setback toward the ASIC 18 of the circuit card assemblies 12 such that the deepest cage has straight-line visibility 68 (indicated with a dotted line) by an installer without the cabinet front post blocking the view. The straight-line visibility 68 maintains line-of-sight such that port LEDs are visible to ease installation of plugs and indicate connectivity. In other words, the setback is sufficiently large so as to enable hand/finger room to insert/remove the deepest plug.

Ganged versions of the angled and stepped cages 62 (FIGS. 6 and 7) groups the cages 62 more closely than single, individual cages, which enables an even smaller footprint. The grouped power phases 11 and/or power phase card (FIG. 8-16) also reduce the footprint of the circuit card assembly 12. The angled and stepped cage configuration and/or the grouped power phase 11 configuration also enables more airflow in the housing 50 in general and airflow tunnels to prevent preheating of one cage to another.

As described in the various embodiments described herein, the physical placement of cages around the ASIC, where the cages are angled and stepped enables beneficial cooling and setback of the cages. Embodiments including grouped power phases 11, angled cages, and/or stepped cages enable substantially shortened track lengths such that XSR SerDes work rather than requiring VSR SerDes. 1.5" PCB tracks @ 0.85 dB/inch, for example, may achieve a little as 1.3 dB PCB loss. The cage connector is 2 dB and the module PCB is 2 dB, totaling is 5.3 dB, which fits under a 6 dB XSR budget.

Figure 18:
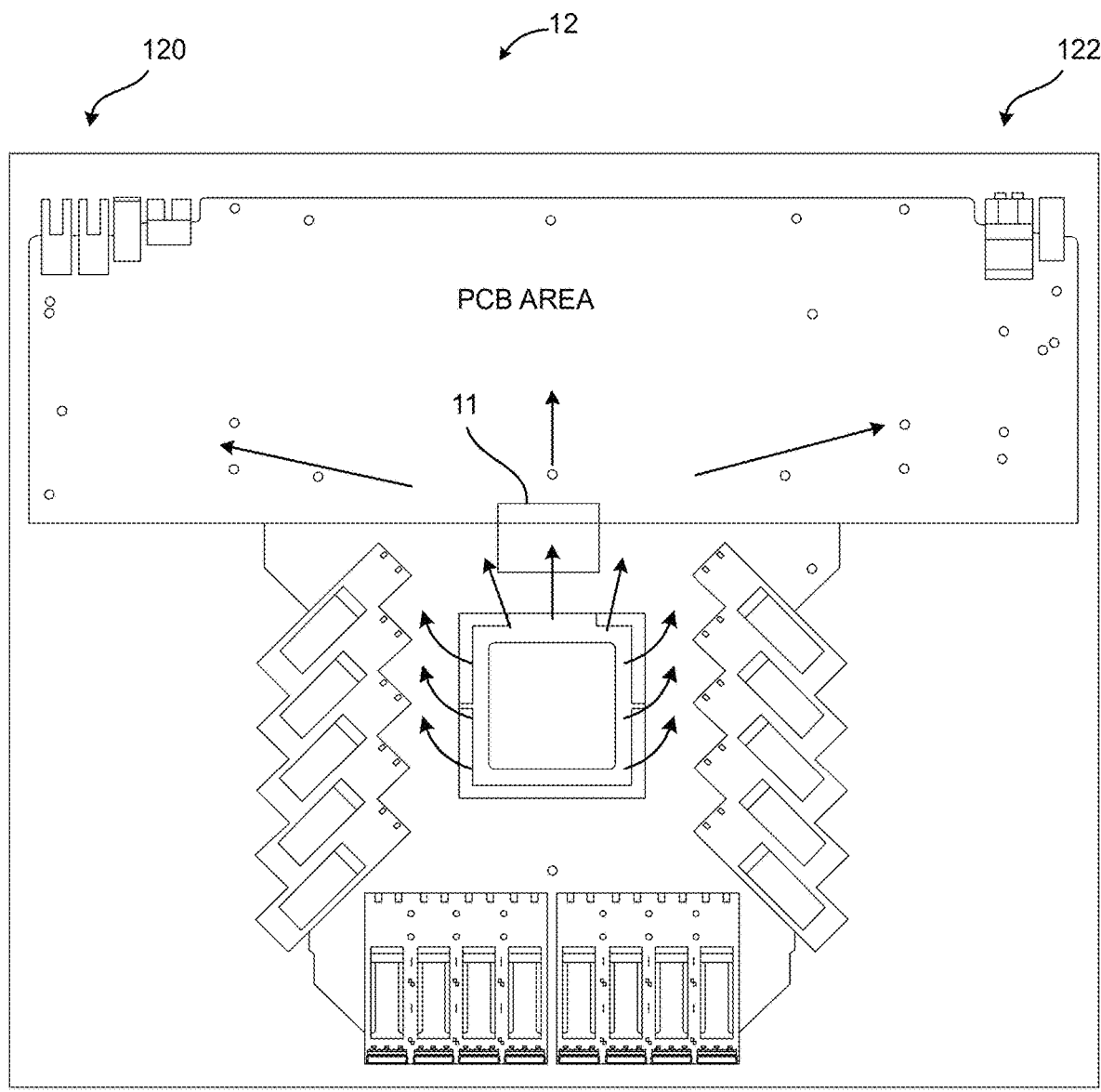
FIG. 18 illustrates a top view of one embodiment of a circuit card assembly, in accordance with aspects of the present subject matter.

FIG. 18 illustrates a top view of one embodiment of a circuit card assembly of the present disclosure. Shown is an exemplary inlet 120 and an exemplary outlet 122, which are for cooling vapor and/or cooling liquid flow. The positions of the inlet 120 and the outlet 122 may vary, depending on the particular implementation. For example, the positions of the inlet 120 and the outlet 122 may be swapped or positioned elsewhere on the PCB. In various embodiments, the flow of the cooling vapor and/or cooling liquid flow from the front (e.g., front plate) to the rear of the circuit card assembly 12 where the inlet 120 and the outlet 122 are located, as indicated by the arrows.

Figure 19:
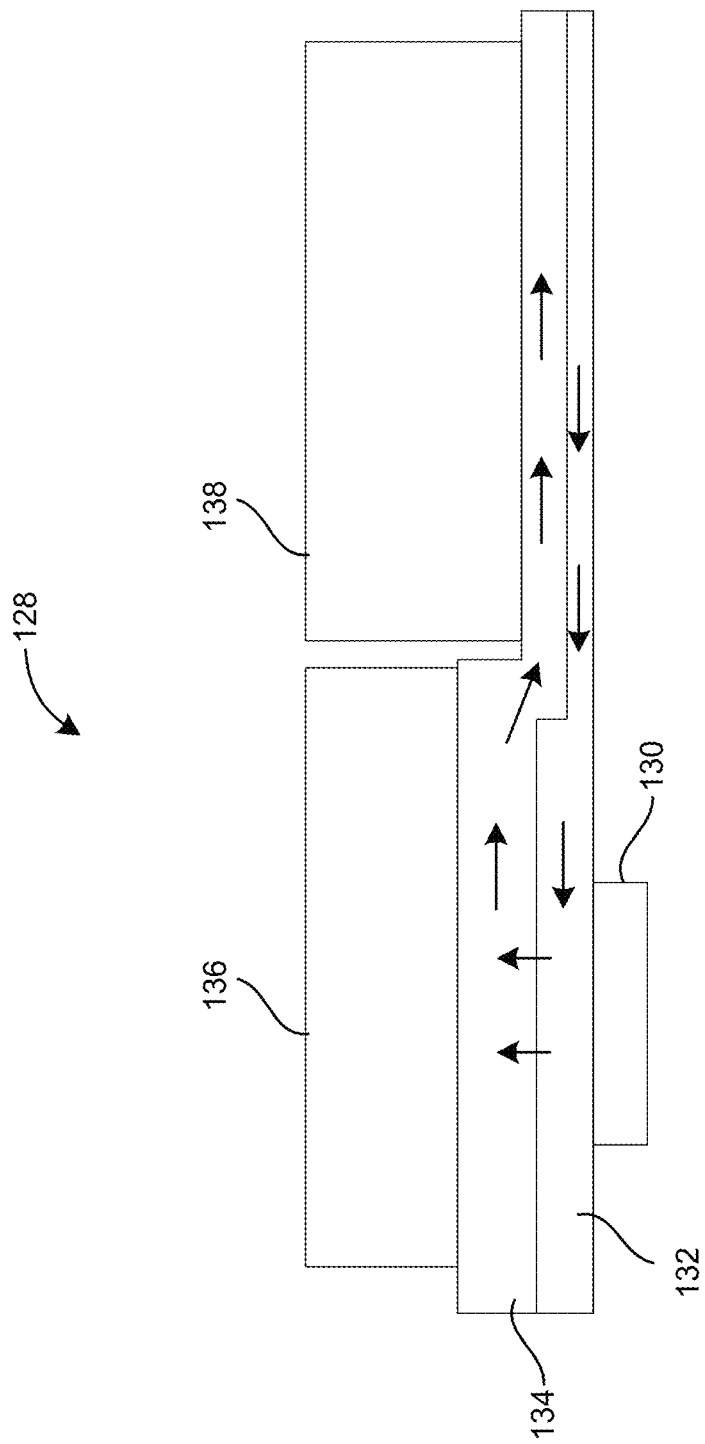
FIG. 19 illustrates a side view of one embodiment of a vapor chamber, in accordance with aspects of the present subject matter.

FIG. 19 illustrates a side view of one embodiment of a vapor chamber of the present disclosure. As shown, a vapor chamber 128 is a cooling assembly in the case of the shelf assembly. The vapor chamber 128 is disposed over a heat source 130, which may be an ASIC, for example. A wicking mechanism or wick 132 is disposed above the heat source 130, between the heat source 130 and a circulation channel, where the wick 132 wicks heat away from the heat source 130 and toward the circulation channel. The circulation channel is disposed within the case and adjacent to a component side of the printed circuit board. The circulation channel directs vapor and/or liquid across the component side of the printed circuit board to reduce heat from one or more heat sources, such as the integrated circuit chip or ASIC. The circulation channel may also be referred to as a vapor channel or vapor path 134. Cooling vapor and/or cooling liquid flows through the circulation channel or vapor path 134 away from the heat source 130 to carry heat away the heat source. Cooled vapor and/or liquid circulates back to the heat source 130 via the wick 132. Heat sink fins 136 and 138 are disposed over the circulation channel or vapor path 134 to further draw heat away from the heat source 130. As shown, the top surfaces of heat sink fins 136 and 138 are at substantially the same height or substantially flush at their top surfaces, where the heat sink fin 136 directly above the heat source is thinner than the other heat sink fins such as heat sink fin 138. This allows room for a thicker or bigger portion of the vapor path 134 directly above the heat source 130, for increased flow.

Given these space constraints of a smaller vapor chamber, the thickness of the vapor chamber may be increased as necessary to ensure that the vapor chamber performs as required. The thickness elsewhere may be maintained or minimize thickness for maximum heat sink fin area, as shown. More specifically, consider a thicker or larger vapor chamber, a bigger dim normal to the page (e.g., 9 mm instead of 6 mm, etc., or whatever the baseline thickness is). The vapor chamber is positioned over and adjacent to the ASIC (e.g., within the first 20 mm of the ASIC-heat-source edge, or thumb-in-air value). This improves the cross-section area for vapor transport, in particular where vapor speed is the greatest, and allows for a lower peak speed, and lower total vapor differential pressure (DP). This also allows for a greater wick cross-section and/or improved wick structure where the return-liquid speed is greatest. These improvements (e.g., vapor speed reduction, vapor DP reduction, wick-structure, etc.) all serve not only to maximize vapor chamber performance, to keep the vapor chamber from reaching its physical limits of use (e.g., dry-out, etc.). In the regions farther from the ASIC, the thickness may be minimized (e.g., <=6 mm; as desired to preserve maximum heat sink fin surface area wherever possible, etc.). Furthermore, by placing the grouped power phases 11 away from the ASIC 18, the available vertical space for heat sink fins 136 and/or the vapor path 134 may be increased, as described herein.

The example embodiments described herein provide reduced trace lengths of optical ports. These reduced trace lengths eliminate the need of adding extra retimer/redriver/flyover cables for extreme port's SerDes lines. This helps in significant BOM cost reduction and reduces or eliminates thermal complexity. Grouped power phases 11 included in a power phase card and/or the busbar(s) 140 provide additional advantages. The power phase card may be configured with space under the power phase card to position other components of the circuit card assembly 12. The power card busbar configured to provide power to the ASIC busbar(s) 140 generally allows for easy decoupling of the power phase card. It should be appreciated that positioning the grouped power phases 11 on the power phase card allows for simple removal and replacement of the power phase card when there is a power phase failure. Moreover, if future power phases are more efficient, are smaller, or provide other advantages over the power phases of an installed power phase card, the installed power phase card may be easily swapped out for a power phase card including the improved power phases. It should be appreciated that exchanging the power phase card may not require further altercations to the main card design. Furthermore, the use of one more busbars 140 coupled to grouped power phases 11 positioned away from respective sides of an ASIC 18 may generally reduce the complexity of the associated circuit card assembly 12. By simplifying the design of the associated circuit card assembly 12, fewer layers may be required for the PCB 16 and/or cheaper materials may be utilized. Furthermore, simplifying the circuit card assembly 12 may increase the number of fabricators able to provide a suitable PCB 16, further reducing costs and potentially increasing production rates. The busbar(s) 140 could also be used as heat-sink devices, extracting heat from PCB 16. If space allows, fins could be added to sides or edge of busbar(s) 140.

Although the present disclosure is illustrated and described herein with reference to illustrative embodiments and specific examples provided, it will be readily apparent to those of ordinary skill in the art that other embodiments and examples may perform similar functions and/or achieve like results. All such equivalent embodiments and examples are within the spirit and scope of the present disclosure and are intended to be covered by the following non-limiting claims for all purposes.

What is claimed is:

1. A circuit assembly adapted to be inserted into a conformal shelf assembly, the circuit assembly comprising:
   a printed circuit board;
   an integrated circuit chip coupled to the printed circuit board;
   a plurality of power phases associated with the integrated circuit chip arranged as grouped power phases, wherein at least one power phase of the grouped power phases is physically distanced from a first side of the integrated circuit chip associated with the at least one physically distanced power phase of the grouped power phases; and
   a plurality of cages or signal sources coupled to the printed circuit board and disposed around one or more other sides of the integrated circuit chip such that the plurality of power phases are not disposed between the integrated circuit chip and any of the plurality of cages or signal sources.

2. The circuit assembly of claim 1, further comprising:
   a first busbar communicatively coupled between the at least one physically distanced power phase of the grouped power phases and the first side of the integrated circuit chip associated with the at least one physically distanced power phase.

3. The circuit assembly of claim 2, wherein the first busbar is communicatively coupled between a second physically distanced power phase of the grouped power phases and a second side of the integrated circuit chip associated with the second physically distanced power phase.

4. The circuit assembly of claim 3, wherein the first busbar is communicatively coupled between a third physically distanced power phase of the grouped power phases and a third side of the integrated circuit chip associated with the third physically distanced power phase.

5. The circuit assembly of claim 4, wherein the first busbar is communicatively coupled between a fourth physically distanced power phase of the grouped power phases and a fourth side of the integrated circuit chip associated with the fourth physically distanced power phase.

6. The circuit assembly of claim 4, wherein the first busbar defines a U-shaped profile with each side of the U-shaped first busbar coupled to a separate side of the integrated circuit chip.

7. The circuit assembly of claim 2, further comprising:
   a second busbar communicatively coupled between a third physically distanced power phase of the grouped power phases and a third side of the integrated circuit chip associated with the third physically distanced power phase.

8. The circuit assembly of claim 7, wherein the second busbar is communicatively coupled between a fourth physically distanced power phase of the grouped power phases and the second side of the integrated circuit chip associated with the fourth physically distanced power phase.

9. The circuit assembly of claim 2, wherein the first busbar is coupled to the printed circuit board and disposed conformally around at least a portion of the perimeter of the integrated circuit chip.

10. The circuit assembly of claim 2, wherein the first busbar is further configured as a stiffener adapted to at least partially support the integrated circuit chip relative to the printed circuit board.

11. The circuit assembly of claim 2, wherein the first busbar comprises a dual layer busbar including a power path and a return path.

12. The circuit assembly of claim 1, wherein the grouped power phases are positioned proximate to one side of the integrated circuit chip.

13. The circuit assembly of claim 1, wherein the grouped power phases include separately arranged subgroups of the grouped power phases, wherein each subgroup of the grouped power phases includes a power phase associated with a side of the integrated circuit chip that is different from the sides of the integrated circuit chip associated with the power phases of the other subgroups of the grouped power phases.

14. The circuit assembly of claim 1, further comprising:
   a power phase card coupled to the printed circuit board, wherein the grouped power phases are directly coupled to the power phase card.

15. The circuit assembly of claim 14, wherein the power phase card is physically distanced from two or more sides of the integrated circuit chip such that the grouped power phases are physically distanced from the two or more sides such that connectors may be positioned adjacent to the two or more sides to reduce power consumption of the integrated circuit chip.

16. The circuit assembly of claim 14, wherein the power phase card is physically distanced from three sides of the integrated circuit chip.

17. The circuit assembly of claim 14, wherein the power phase card includes a power card busbar communicatively coupled between the grouped power phases and another busbar associated with the integrated circuit chip.

18. The circuit assembly of claim 1,
wherein each cage or signal source of the plurality of cages or signal sources is positioned within one inch of a side of the integrated circuit chip associated with the cage or signal source.

19. A circuit pack, the circuit card pack comprising:
a printed circuit board;
an integrated circuit chip coupled to the printed circuit board;
a plurality of power phases associated with the integrated circuit chip arranged as grouped power phases, wherein at least one power phase of the grouped power phases is physically distanced from a side of the integrated circuit chip associated with the at least one physically distanced power phase of the grouped power phases; and
a plurality of cages or signal sources coupled to the printed circuit board and disposed around one or more other sides of the integrated circuit chip such that the plurality of power phases are not disposed between the integrated circuit chip and any of the plurality of cages or signal sources.

20. The circuit pack of claim 19, further comprising:
a busbar communicatively coupled between the at least one physically distanced power phase of the grouped power phases and the side of the integrated circuit chip associated with the at least one physically distanced power phase.

* * * * *